(12) United States Patent
Staszewski et al.

(10) Patent No.: US 6,606,004 B2
(45) Date of Patent: Aug. 12, 2003

(54) SYSTEM AND METHOD FOR TIME DITHERING A DIGITALLY-CONTROLLED OSCILLATOR TUNING INPUT

(75) Inventors: Robert B Staszewski, Garland, TX (US); Kenneth Maggio, Dallas, TX (US); Dirk Leipold, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/838,451

(22) Filed: Apr. 19, 2001

(65) Prior Publication Data

US 2002/0033737 A1 Mar. 21, 2002

Related U.S. Application Data

(60) Provisional application No. 60/198,901, filed on Apr. 20, 2000, and provisional application No. 60/199,017, filed on Apr. 20, 2000.

(51) Int. Cl.[7] .................................................. H03L 7/00
(52) U.S. Cl. ............................................ 331/17; 331/78
(58) Field of Search ........................ 331/17, 57, 117 R, 331/117 FE, 1 A, 78, 179, 175; 327/158

(56) References Cited

U.S. PATENT DOCUMENTS

| | | | |
|---|---|---|---|
| 5,036,294 A | | 7/1991 | McCaslin |
| 5,517,155 A | * | 5/1996 | Yamauchi et al. .......... 327/107 |
| 5,847,559 A | | 12/1998 | Takaoku et al. |
| 5,963,160 A | | 10/1999 | Wilson et al. |
| 6,028,488 A | * | 2/2000 | Landman et al. ........... 327/156 |
| 6,208,211 B1 | | 3/2001 | Zipper et al. |

FOREIGN PATENT DOCUMENTS

| EP | 0 414 444 A2 | 2/1991 |
|---|---|---|

* cited by examiner

*Primary Examiner*—Robert Pascal
*Assistant Examiner*—Joseph Chang
(74) *Attorney, Agent, or Firm*—Ronald O. Neerings; Wade James Brady, III; Frederick J. Telecky, Jr.

(57) ABSTRACT

A technique of time dithering a fully digitally-controlled oscillator (DCO) tuning input employs a shift register 1306 and a multiplexer 1308 responsive to a sigma-delta modulated delay control to minimize spurious tones generated by a DCO 200. The shift register 1306 is clocked via a divided-down high-frequency reference provided by the DCO 200 output signal. The multiplexer 1308 is clocked via a frequency reference that is reclocked and synchronized to the DCO 200 output signal. The multiplexer 1308 output is thus time dithered in response to a delay control to minimize perturbations caused by switching.

19 Claims, 19 Drawing Sheets

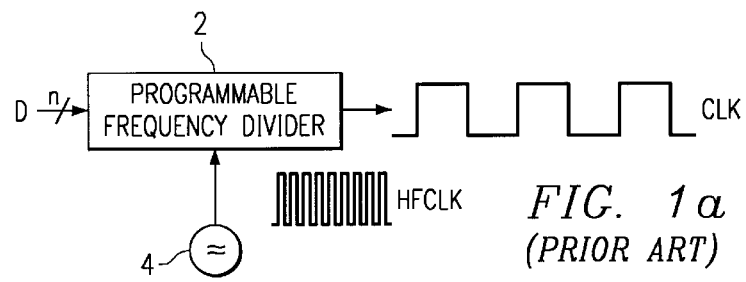
FIG. 1a
(PRIOR ART)
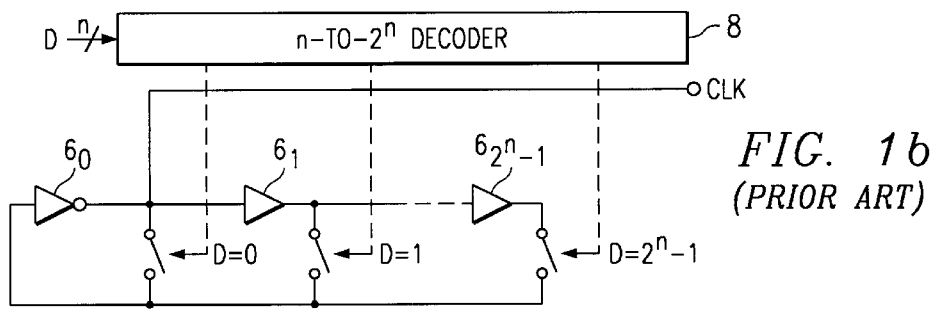
FIG. 1b
(PRIOR ART)
FIG. 1c
(PRIOR ART)
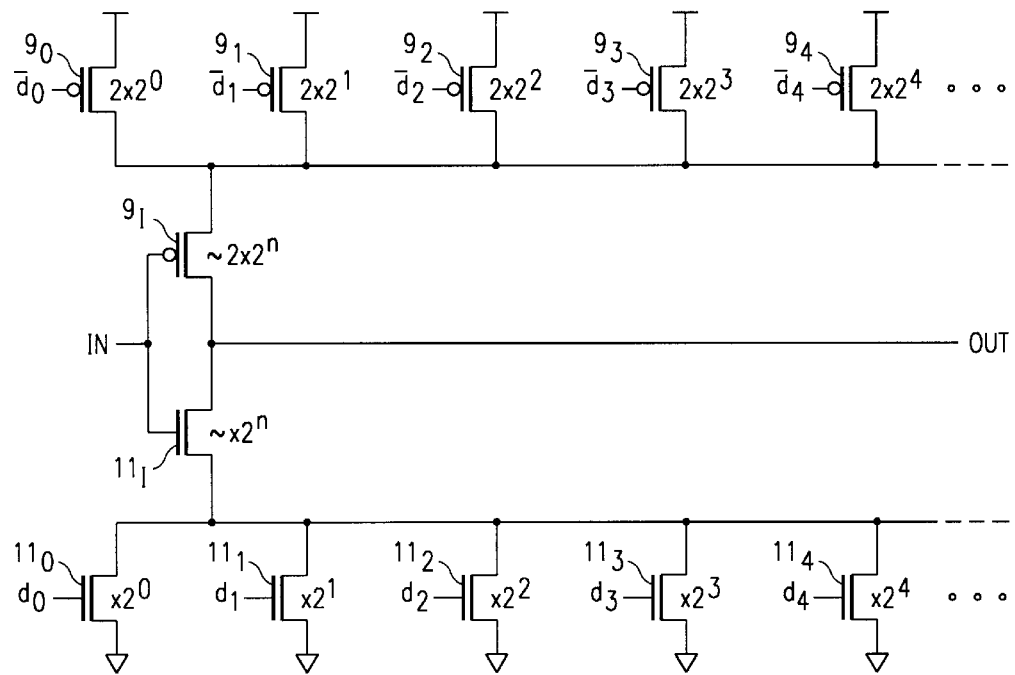

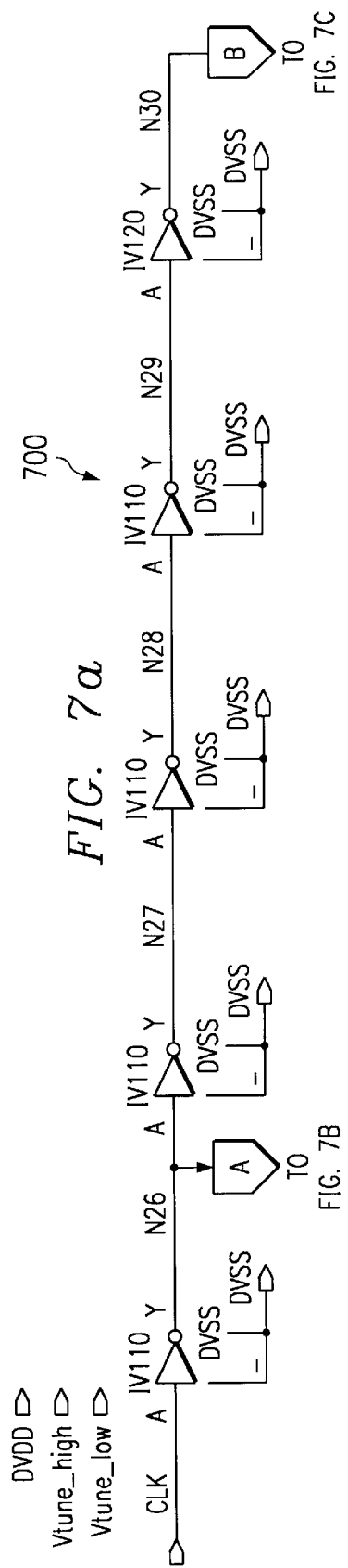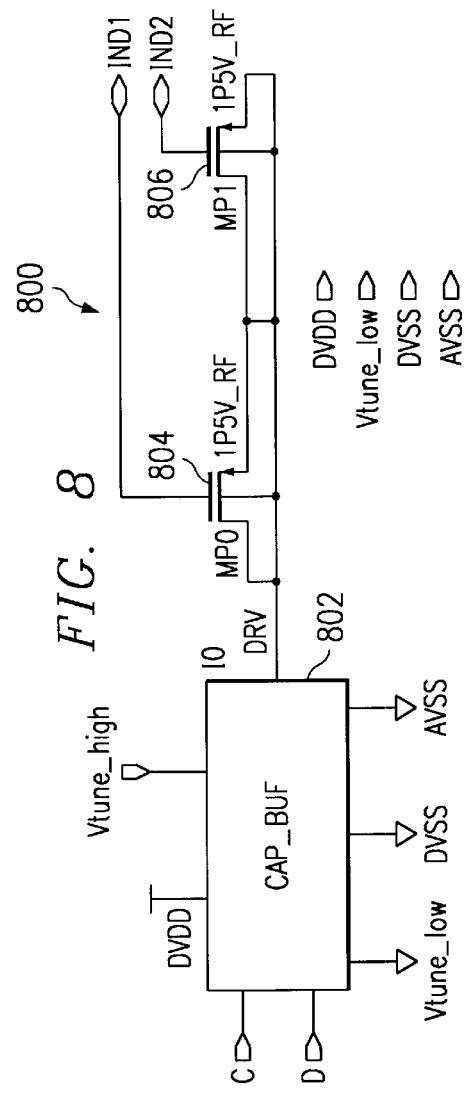

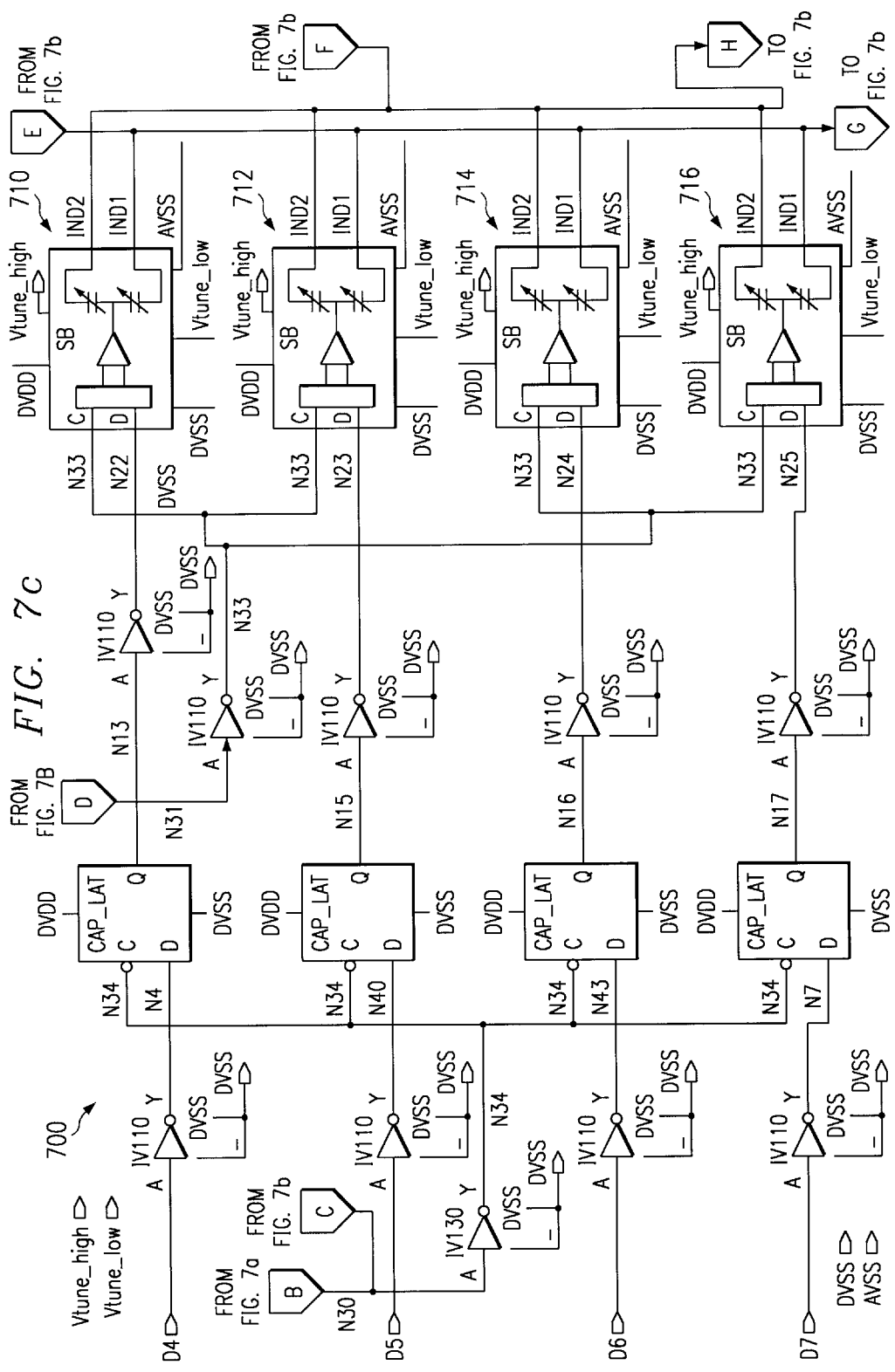

SYSTEM AND METHOD FOR TIME DITHERING A DIGITALLY-CONTROLLED OSCILLATOR TUNING INPUT

RELATED PATENT APPLICATIONS

This application claims the benefit, under 35 U.S.C. §119(e)(1), of U.S. Provisional Application No. 60/198,901, entitled TIME DITHERING METHOD OF THE VCO CONTROL INPUT, filed Apr. 20, 2000 by Robert B. Staszewski, Kenneth Maggio and Dirk Leipold. This application also claims the benefit of U.S. Provisional Application No. 60/199,017, filed Apr. 20, 2000 by Robert B. Staszewski, Kenneth Maggio and Dirk Leipold. Further, this application is related to U.S. patent application Ser. No. 09/679,793, entitled Digitally-Controlled L-C Oscillator, filed Oct. 5, 2000 by Dirk Leipold and Robert B. Staszewski.

BACKGROUND OF THE INVENTION

1. Field of the Invention

This invention relates generally to voltage controlled oscillators, and more particularly to a method of time dithering a fully digitally-controlled oscillator (DCO) tuning input.

2. Description of the Prior Art

Operating clock rates of modem VLSI circuits, such as microprocessors and digital signal processors (DSPs), have increased greatly over recent years. These clock rates, now up to on the order of GHz, and the corresponding increase in the number of operations that can be performed over time by the VLSI circuits, have provided dramatic increases in the functionality of electronic computing systems, including mobile, battery-powered, systems such as notebook computers, wireless telephones, and the like. In order to provide such high speed functionality, functions such as on-chip clock generation and clock recovery (i.e., generation of timing information from serial bitstreams) must of course operate at these high frequencies.

As related to clock generation, the increase in clock frequencies has in turn made the timing constraints for communication among the various integrated circuits more stringent. Particularly in systems that utilize synchronous operation and data communication among multiple integrated circuits, the timing skew between external system clocks and the internal clocks that control the operation of the integrated must be reduced to very small margins.

Conventional systems generally utilize analog PLLs for on-chip generation and synchronization of internal clock signals from system reference clocks. Typical analog PLLs include a phase detector that compares the phase relationship of the reference clock to an internal clock, a charge pump and loop filter for setting an analog voltage corresponding to this phase relationship, and a voltage-controlled oscillator (VCO) for generating an output clock signal in response to the analog voltage from the charge pump and loop filter. In recent years, digital phase detectors have been used in on-chip PLLs in combination with the analog charge pump and filter, and the analog VCO; such PLLs have been referred to as "digital", but of course in reality these PLLs are hybrid digital and analog circuits.

Recently, efforts have been made toward the development of fully digital PLLs. In combination with a digital phase detector, fully digital PLLs include a digital loop filter instead of the traditional analog filter, and include a digitally-controlled oscillator instead of the voltage-controlled oscillator. In theory, these fully digital PLLs have several advantages over their analog counterparts. First, digital logic exhibits much better noise immunity than analog circuitry. Second, analog components are vulnerable to DC offset and drift phenomena that are not present in equivalent digital implementations. Further, the loop dynamics of analog PLLs are quite sensitive to process technology scaling; whereas the behavior of digital logic remains unchanged with scaling. This requires much more significant redesign effort to migrate analog PLLs to a new technology node than is required for digital PLLs.

Moreover, power dissipation is of extreme concern for portable, battery-powered, computing systems, as power dissipation relates directly to battery life. As a result, many manufacturers are reducing the power supply voltage requirements of the integrated circuits, particularly those that are specially adapted for portable computing systems, to reduce the power consumed by these devices. It has been observed however, that a reduction in the power supply voltage applied to analog circuitry, such as analog or hybrid PLLs, does not necessarily reduce the power dissipated by these circuits; in some cases, aggressive voltage scaling has been observed to increase the power dissipated by analog circuits. Additionally, reduction in the power supply voltage to analog circuits renders the design of robust circuits much more difficult, given the reduced available "headroom" for the circuits.

In view of the foregoing, PLLs in which digital techniques are used in not only the phase detector, but also in the loop filter and the controllable oscillator, are very attractive to designers. In particular, and as noted above, the implementation of fully digital PLLs to include a digitally-controlled oscillator (DCO), which is an oscillator that operates at a frequency controlled by the value of a digital control word applied thereto, has become especially attractive.

As is known in the art, high frequency circuits other than clock generation circuits also may benefit from the implementation of an all-digital PLL. For example, as noted above, the function of clock recovery (i.e., the extraction of timing information and synchronization from a serial bitstream) is common in effecting high-frequency data communication among integrated circuits and systems. It is, of course, desirable to communicate data at as high a frequency as possible, and as such the frequencies at which clock recovery circuitry are to operate are ever-increasing. Further, considering that communication is a primary function in many battery-powered systems, such as wireless telephones, wireless modems in portable computers, and the like, it is desirable to reduce power dissipation and, consequently, the supply voltage required to implement clock recovery circuits, along with increasing the frequency of operation thereof. As such, many of the advantages provided by fully digital PLLs and the DCOs associated therewith are also beneficial to clock recovery circuits, as well as other applications in modem integrated circuits. The utility of the DCO however, is not limited to PLL applications. In fact, it is contemplated that any application requiring a frequency-programmable oscillator has the potential to benefit from an efficient implementation of a DCO.

The fundamental function of a DCO is to provide an output waveform that has a frequency of oscillation $f_{DCO}$ that is a function of a binary-weighted digital input word D, as follows:

$$f_{DCO} = f(D) = f(d_{n-1} \cdot 2^{n-1} + d_{n-2} \cdot 2^{n-2} + \ldots + d_1 \cdot 2^1 + d_0 \cdot 2^0)$$

Typically, the DCO transfer function $f(\ldots)$ is defined so that either the frequency $f_{DCO}$ or the period of oscillation $T_{DCO}$ is linear with D, generally with an offset. A DCO transfer function, for example, that is linear in frequency is typically expressed as:

$$f(D)=f_{offset}+D \cdot f_{step}$$

where $f_{offset}$ is a constant offset frequency and $f_{step}$ is the frequency quantization step. Similarly, a DCO transfer function that is linear in period is typically expressed as $$T(D)=1/f(D) \approx T_{offset}-D \cdot T_{step}$$

where $T_{offset}$ is a constant offset period and $T_{step}$ is the period quantization step. It is of course evident that, since the DCO period T(D) is a function of a quantized digital input D, the DCO cannot generate a continuous range of frequencies, but rather produces a finite number of discrete frequencies.

One common type of conventional DCO includes a high-frequency oscillator in combination with a dynamically programmable frequency divider. An example of this type of DCO is illustrated in FIG. 1a. In this example, programmable frequency divider 2 receives an n-bit digital word D which indicates the divisor value at which the frequency of the output signal HFCLK of high-frequency oscillator 4 is to be divided in generating the DCO output signal CLK. In this conventional arrangement, the period quantization step $T_{step}$, and thus the lower bound of the timing jitter, is limited to the period of high-frequency oscillator 4. Low jitter operation thus requires oscillator 4 to operate at an extremely high frequency; for example, a 0.2 nsec step between periods requires high frequency oscillator 4 and programmable counter 2 to operate at 5 GHz.

Because of this limitation, other conventional DCO approaches directly synthesize a signal, rather than dividing down from a high frequency source. One example of a conventional direct-synthesis DCO is illustrated in FIG. 1b, which is arranged as a variable length ring oscillator. In this example, $2^n$ delay stages 6 are connected in series, with lowest order stage $6_0$ being an inverting stage and driving the output signal on line CLK. Decoder 8 decodes n-bit digital control word D in $2^n$ control lines, each of which are operable to short out a corresponding stage 6, and one of which is asserted in response to the value of the digital control word D. The period of oscillation T is thus twice the sum of the delays of those delay stages 6 within the ring. For example, if the delay through each stage 6 is $T_6$, in the case where D=0 such that only stage $6_0$ is in the ring, the period of oscillation T will equal $2T_6$; in the case where $D=2^{n-1}$ (D is at its maximum), the period of oscillation T will equal $2(2^n)T_6$, as all $2^n$ stages 6 will be connected in the ring. In this conventional approach, the period quantization step (which sets a lower bound on the jitter) is thus $2T_6$ or twice the propagation delay of stage 6, which is typically an improvement over that of the conventional DCO of FIG. 1a, but which still may be too course for many applications. However, the integrated circuit chip area required for realization of the variable delay ring oscillator of FIG. 1b is substantial, considering that the number of stages 6 is exponential with the number of bits in the control word D and that typical delay stages can be quite complex, with some reported implementations requiring more than twenty transistors per stage. Further, the complexity of decoder 8 is also exponential with n, itself requiring on the order of $(n+6)2^n$ unit-size transistors. The total complexity of the circuit is therefore relatively large, resulting in a chip area that varies with n by on the order of $(n+30)2^n$. Accordingly, a high resolution DCO constructed in this fashion can occupy a tremendous amount of chip area.

Another known approach to implementation of a digital PLL is described in J. Dunning et al., "An All-Digital Phase-Locked Loop with 50-Cycle Lock Time Suitable for High-Performance Microprocessors", J. Solid State Circ. (IEEE, April 1995), pp. 412–422. According to this conventional approach, the desired output frequency is directly synthesized through the operation of an eight-stage current-starved ring oscillator, one such stage illustrated in FIG. 1c, where each inverting delay stage includes a pull-up leg of parallel binary-weighted transistors 9, and a pull-down leg of parallel binary-weighted transistors 11. Each transistor $9_I$, $11_I$ is turned on by a corresponding bit $d_I$ (or its complement) of the control word d; switching transistors $9_I$, $11_I$ are controlled by the state of line IN, and drive line OUT at their common drain node. While acceptable frequency resolution is provided according to this approach, the amount of integrated circuit chip area required for implementation of this PLL is extremely large. Since NMOS transistor $11_I$ weighted by a factor of $2^i$ is generally realized as $2^i$ minimum-size transistors $11_0$ in parallel, the number of unit-size NMOS transistors $11_0$ in a delay stage such as shown in FIG. 1c is $2(2^n)-1$. Assuming a PMOS transistor 9 to be twice the size of its corresponding NMOS transistors 11, the total number of unit-size transistors required to realize the delay stage of FIG. 1c may be considered as:

$$2(2^n)-1+2[2(2^n)-1]=6(2^n)-3$$

For a DCO of this construction having eight delay stages, the area required for implementation will therefore vary with n by on the order of $48(2^n)$.

By way of further background, another example of a conventional digitally-controlled oscillator is described in F. Lu, H. Samueli, J. Yuan, and C. Svensson, "A 700-MHz 24-b Pipelined Accumulator in 1.2-μm CMOS for Applications as a Numerically Controlled Oscillator", IEEE Journal of Solid-State Circuits, Vol. 28, No. 8 (IEEE, August 1993), pp. 878–886.

One DCO implemented to overcome the disadvantages described above in association with conventional digitally-controlled oscillators known in the art is disclosed in U.S. Pat. No. 6,028,488, entitled Digitally-controlled oscillator with switched-capacitor frequency selection, issued Feb. 22, 2000 to Landman, et al. The DCO disclosed in the '488 patent is realized by way of a switched-capacitor array that loads a driver within the oscillator. The switched-capacitor array includes a binary-weighted set of capacitors, each of which has its capacitance controlled by one bit of a digital control word from a digital loop filter. The step size between adjacent oscillation periods, and thus the jitter, is defined by the capacitance of the least significant capacitor (corresponding to the LSB of the control word) in combination with the strength of the driver.

Digitally-controlled oscillators that employ fully digital phase-locked loops (PLLs) of type I (i.e., only one integrating pole due to the DCO frequency-to-phase conversion) generally feature faster dynamics and are used where fast frequency/phase acquisition is required or direct transmit modulation is used. Unlike in type II PLL loops however, where the steady-state phase error goes to zero in face of a constant frequency offset (i.e., frequency deviation between the actual and center DCO frequencies), the phase error in type I PLL loops is proportional to the frequency offset. Although loop dynamics can be improved through elimination of loop filtering, this leads to the increase in the so-called reference feedthrough in which the phase detector update events get transferred and frequency-modulate the DCO output. This shows itself as the spurious tones at the RF output.

SUMMARY OF THE INVENTION

In view of the foregoing, it is desirable and necessary to provide a method of time dithering a digitally-controlled oscillator (DCO) tuning control word input in order to substantially eliminate frequency modulation of the DCO output in response to phase detector update events in such a way that spurious tones can be substantially eradicated at the DCO RF output.

In one aspect of the invention, a DCO is therefore provided that can operate at low power supply voltages while substantially eliminating spurious tones at the RF output.

In still another aspect of the invention, a DCO is further provided that operates with extremely low levels of jitter while substantially eliminating spurious tones at the RF output.

In yet another aspect of the invention, a DCO is also provided that requires a relatively modest amount of chip area relative to conventional DCO circuits while still capable of substantially eliminating spurious tones at the RF output.

In yet another aspect of the invention, a DCO is provided that can function in association with a digital phase-locked loop (PLL) to substantially eliminate spurious tones at the RF output.

In yet another aspect of the invention, a DCO is provided that has significantly smaller oscillator phase noise than that generated by known DCOs that employ a delayed feedback using a variable load, such that spurious tones at the RF output are substantially eliminated.

In still another aspect of the invention, a DCO is provided that operates with substantially any negative resistance feedback source (Colpitts oscillator, gun diode, and the like) to achieve stable oscillation in a manner that substantially eliminates spurious tones at the RF output.

In still another aspect of the invention, a DCO is provided that accommodates the modulation and channel selection requirements associated with the "BLUETOOTH" standard while substantially eliminating spurious tones at the RF output.

A digitally-controlled oscillator according to one embodiment may be constructed as an LC tank oscillator (i.e., digitally-tunable tank circuit), where the resonant frequency inside the oscillator is changed. The LC tank oscillator is a resonator that is formulated from virtually any negative resistance source (e.g., Colpitts oscillator, gun diode, and the like) to bring the resonator to a stable oscillation. A binary-weighted capacitor bank is employed in association with a small bank of unity minimum size capacitors that are switched fast between two states to dither or modulate (similar to dithering as used in conventional D/A converters, except the present dithering is digital-to-frequency conversion rather than digital-to-analog conversion) the LSB(s) and use the Q of the digitally-tunable tank circuit as a low pass function. A DCO that uses such a tank circuit has significantly reduced phase noise when compared with conventional DCOs in which the feedback is delayed using a variable load, since the tank circuit of the present invention can be designed with a high Q. The DCO is therefore realized using an LC tank circuit in which the frequency resolution can be adjusted in such a way as to accommodate both modulation and channel selection requirements necessary to achieve "BLUETOOTH" RF communication otherwise not achievable using other known DCO architectures. As used herein, RF means any frequency that can be communicated over the communications medium that is being utilized.

According to one embodiment of the present invention, a time dithering scheme suitable for use with the foregoing DCO is illustrated in Figures. The tuning control word is a digital word and is synchronous to the compare frequency of the phase detector. The tuning control word would normally be connected to the digitally-controlled oscillator input through a gain stage if a loop filter is not used, such as illustrated in the phase-domain all-digital synchronous PLL synthesizer shown in FIG. 3. An accurate discrete time dithering of the tuning control word is obtained by reclocking it by the high-frequency oversampling clock and passing it through a delay shift register. A multibit input multiplexer synchronously selects the appropriate output of the delay register chain. This technique provides a means of dynamically offsetting the actual DCO update timing, which is done at the frequency reference rate, discretely by the oversampling clock. The digitized RF output of the synthesizer would be used as the high-frequency oversampling clock directly or after an appropriate frequency division, for example, by an edge-divider such as depicted in FIG. 14. The DCO may receive a digital input word from a digital PLL in a manner such as disclosed in U.S. patent application Ser. No. 09/603,023, entitled Digital Phase-Domain PLL Frequency Synthesizer, docket no. TI-30677, by Robert B. Staszewski and Dirk Leipold, filed Jun. 26, 2000, and that is incorporated by reference herein in its entirety.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein:

FIGS. 1a through 1c are electrical diagrams, in block form, of conventional digitally-controlled oscillators;

FIG. 8 is a schematic diagram illustrating a more detailed view of a capacitor pair for the thermometer capacitor bank shown in FIG. 7;

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 2:
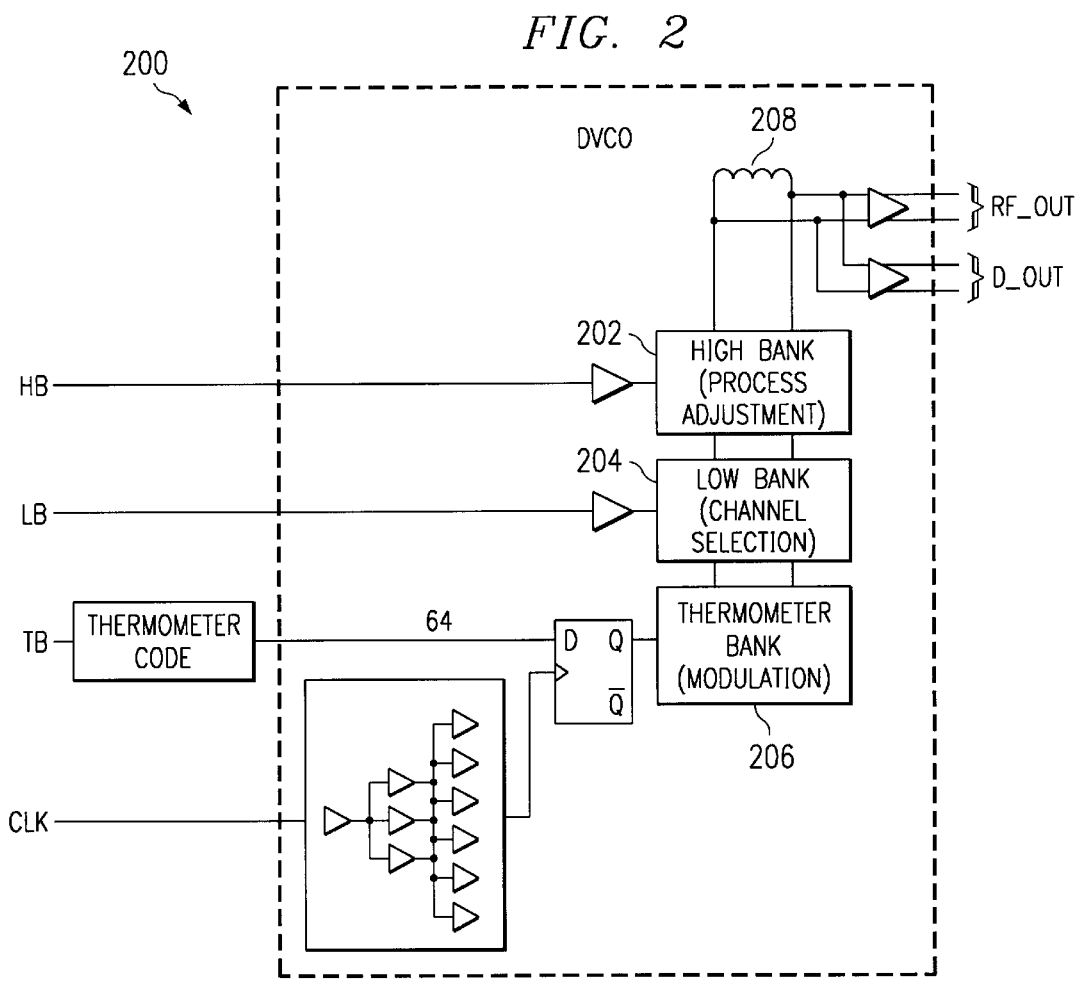
FIG. 2 is a high-level block, diagram illustrating a digitally-controlled VCO (DVCO/DCO)

Looking now at FIG. 2, a high-level block diagram of a DCO 200 can be seen to include two binary-weighted switched capacitor banks (high bank (HB) 202 and low bank (LB) 204) in combination with a bank of equally-weighted switched capacitors (thermometer bank (TB)/LSB dithering system) 206 and that are integrated with an inductor 208 to implement a digitally tunable VCO system. It can be appreciated that DCO 200 may be integrated with many different types of digital PLLs suitable for use in an integrated circuit, such as a digital signal processor or such as the digital phase-domain PLL frequency synthesizer 300 depicted in FIG. 3. A detailed discussion of the synthesizer 300 is presented in the '023 patent application referenced herein before and is presented herein only to demonstrate one such use of the DCO 200. With continued reference now to FIG. 2, the HB 202 bits, LB 204 bits and TB 206 bits could ultimately come, for example, from the gain element 302 depicted in FIG. 3 to generate a DCO tuning control word (TCW), alternatively referenced as oscillator tuning word (OTW). The gain element 302, described more fully in the '023 patent, is necessary in order to have a controlled frequency response of the DCO 200 and the PLL loop behavior. The HB 202 bits, LB 204 bits and TB 206 bits can be formulated of any convenient or desired number of bits, limited by only the technology and architecture employed. The control word can be generated therefore, using the process described in the '023 application, incorporated by reference herein. The present inventors found that a workable DCO can be implemented by keeping the HB 202 bits programmable, so that a user or ARM controller, for example, can set them appropriately in the center of the desired operational band. The TB 206 bits are the thermometer-encoded bits that come from the lower order part of the same control word that contains the LB 204 bits. One or more of the TB 206 bits are then dithered or delta-sigma modulated in a manner described more fully herein below, to generate a small frequency modulation having a very small modulation index in combination with a very high modulation speed such that the sidebands generated are very small. In this way, a much higher resolution can be achieved as contrasted with a DCO architecture that simply uses a switched capacitor bank, since the resolution obtainable using the switched capacitor bank is fundamentally limited to the capacitance of the least significant capacitor (corresponding to the LSB of the control word), as stated herein before. According to one embodiment, the dithering process most preferably then further increases the resolution of the controllable LSB(s) such that at least 22-bits of resolution can be obtained using a 1.2 volt supply in order to accommodate "BLUETOOTH" modulation and channel selection requirements. The DCO 200 includes a tunable LC tank circuit that may have a center-tapped transformer-like inductor 208 and in which the capacitance is determined via a plurality of varactor banks comprising the high bank (HB) 202, low bank (LB) 204 and the thermometer bank (TB) 206. It can be appreciated that many other LC tank circuit architectures may be employed to implement the DCO 200. The varactor banks 202, 204, 206 can be implemented such as the binary-weighted array of controllable capacitors described in association with the DCO disclosed in the '488 patent referenced herein above, but modified as discussed herein to accommodate dithering of one or more LSB capacitors as illustrated for the embodiment depicted in FIG. 2. The LC tank circuit has a resonant frequency that can then be modified or changed by the present dithering process since the one or more LSB capacitors in the TB varactor bank 206 can be selectively dithered. It can be appreciated that the Q of the LC tank circuit performs a time-averaging operation. In this way, a low-pass filtering function equivalent necessary to realize very fast sigma-delta modulated digital-to-frequency conversion is implemented such that spurious radiation can be generated only outside the frequency band of interest, and that can be easily suppressed via an antenna filter.

Most preferably, digital-to-frequency conversion is updated, for example, at a much higher frequency ($>>f_{ref}$) than that generally used by conventional DCOs such that the frequency update is shifted outside the band of interest wherein the sigma-delta processing gain is implemented within the frequency band associated with the antenna filter.

The spurious response is then also shifted to the much higher frequency where they are suppressed by the sigma-delta processing; and any residual tones remaining are then eliminated by the antenna filter (not shown). The present sigma-delta processing architecture has been found by the present inventors to operate in the absence of a control voltage to increase the achievable resolution to about 1 kHz, whereas conventional DCOs function with a maximum resolution of about 20 kHz.

Each capacitor within varactor banks 202, 204, 206 is most preferably driven by one bit of the control word communicated to the varactor bank, in which each bit of the control word can change between two voltage states ($V_{tunehigh}$ and $V_{tunelow}$). Most preferably, the two voltage states ($V_{tunehigh}$ and $V_{tunelow}$) are selected such that the associated LC circuit tuning characteristics (frequency versus voltage) have a zero local frequency dependency. It can be appreciated then, that no noise can "walk through" the LC circuit at the two voltage states ($V_{tunehigh}$ and $V_{tunelow}$), and the LC circuit will be robust to noise during the dithering process. The present inventors have found the present dithering process to have a very strong power supply rejection ratio (PSRR), on the order of tens of kHz as compared with conventional DCOs using switched capacitor bank techniques that have PSRRs between 1 MHz and 10 MHz. Since the present dithering process is insensitive to noise, the DCO 200 can advantageously be driven without use of a voltage regulator, an important advantage over conventional DCOs.

Figure 4:
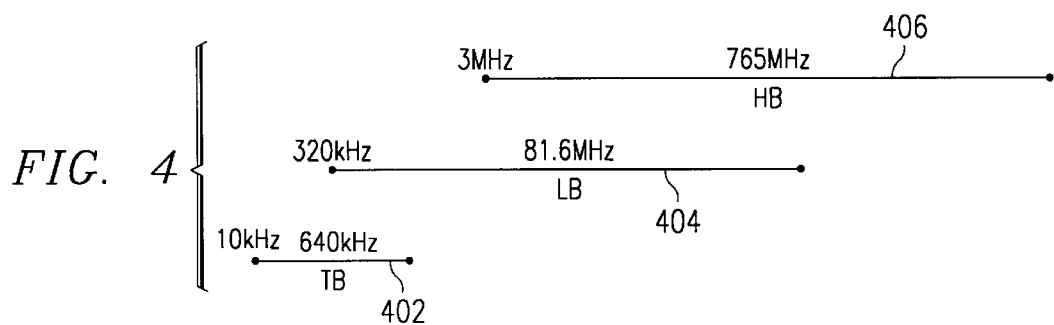
FIG. 4 is a diagram illustrating high bank, low bank and thermometer bank control ranges and granularities associated with the DCO high, low and thermometer capacitor banks depicted in FIG. 2 and suitable to accommodate the Gaussian frequency shift keying (GFSK) modulation scheme of "BLUETOOTH" or GSM.

FIG. 4 is a diagram illustrating high bank, low bank and thermometer bank control ranges and granularities (logarithmic scale) associated with the DCO high, low and thermometer varactor banks 202, 204 and 206, depicted in FIG. 2 that are suitable to accommodate the Gaussian frequency shift keying (GFSK) modulation scheme of "BLUETOOTH" or GSM. Each capacitor bank 202, 204, 206 contains voltage-controlled capacitors (varactors), wherein each bank has its associated capacitor values set differently from one another to control different oscillation frequency ranges and granularity. Further, they differ in control word coding schemes.

The high bank (HB) 202 is most preferably implemented to coarsely center the operating frequency range of the DCO 200 due to process, supply voltage, and/or temperature variations. The HB 202 bits are also most preferably calibrated only on power-up or any other "as needed" basis. This bank 202 controls the largest frequency range and has a granularity that is quite coarse. The high bank 202 therefore comprises the largest value varactors among the capacitor banks 202, 204, 206. Since the high bank 202 varactors are binary-weighted, the control word is binary-coded to accommodate switching control wherein the value of the (n+1) order varactor is twice as large as that of the n-order varactor.

The low bank (LB) 204, according to one embodiment, is used for channel hopping (channel selection). The LB 204 sets the center frequency for a transmission channel and most preferably has enough range (plus some margin) to cover all allowed frequency channels (e.g., 78 for "BLUETOOTH"). The granularity of the low bank 204 is most preferably chosen in such a way as to allow the thermometer capacitor bank 206 to cover a contiguous frequency range during data modulation. The LB 204 varactors are most preferably also binary-coded, as discussed above in association with the HB 202 varactors.

The thermometer varactor bank (TB) 206, according to one preferred embodiment, is used for GFSK data modulation. The range that TB 206 must cover therefore is h*R frequency range, where h=modulation index and R=data rate. The present inventors found that due to process variations when the actual TB 206 granularity is smaller than expected, an extra "guard range" should most preferably be added. The minimum TB 206 granularity corresponds to the DCO 200 granularity (non-dithering case) and is related to the achievable minimum size of the unit varactor discussed herein before. As also stated above, the TB 206 is composed of a collection of unit varactors. The purpose is to match the controllable "update" timing on all TB 206 varactors so as to minimize the reference beat when this update is performed in the neighborhood of the zero-crossings of the LC tank voltage. If the TB 206 varactors were binary-weighted, the updates would then be done at different times for different control bits, thereby causing data-dependent spurious tones. The TB 206 bits are most preferably thermometer-coded such that for a control input value N, N varactors are "enabled." This allows a minimal number of varactors to be updated for small updates to the input control word, which applies to modulation.

The frequency granularity of a unit varactor according to one embodiment, was found by the present inventors to be 10 kHz. To accommodate a 2x margin, the TB range necessary for "BLUETOOTH" RF communications is then:

TB_range=2*h*R=2*0.32*1 MHz=[640 kHz], depicted as 402 in FIG. 4; and the bits necessary to represent TB=log2(640 khz/10 kHz)=6-bits.

The LB 204 range is then:
LB_lsb=TB-range-h*R=320 kHz;
which implies the bits necessary for channel selection can be determined from
log2((Nch*R)/(h*R))=78/0.32=243 which implies that 8-bits are necessary; and
LB range=255*LB_lsb=255*320 kHz=[81.6 MHz], depicted as 404 in FIG. 4.

The HB 202 range is:
HB_lsb<LB_range-Nch*R=81.6 MHz–78 MHz=3.6 MHz which implies that HB_lsb can be selected as 3 MHz. Using 8-bits to represent HB,
HB_range=255*HB_lsb=[765 MHz], depicted as 406 in FIG. 4.

Figure 5A:
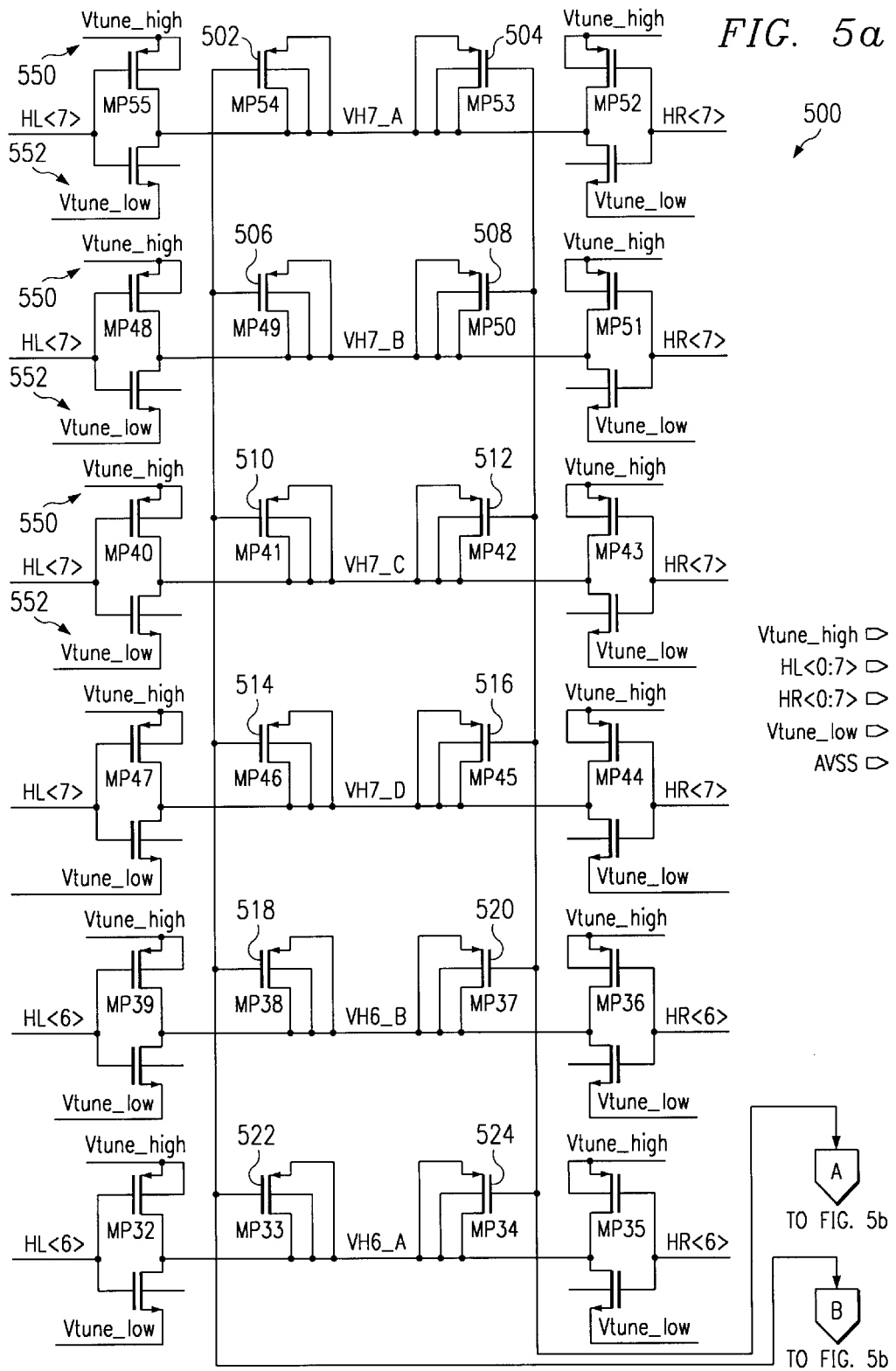
FIG. 5 is a schematic diagram illustrating a high capacitor bank architecture suitable for use with the DCO depicted in FIG. 2.
Figure 5B:
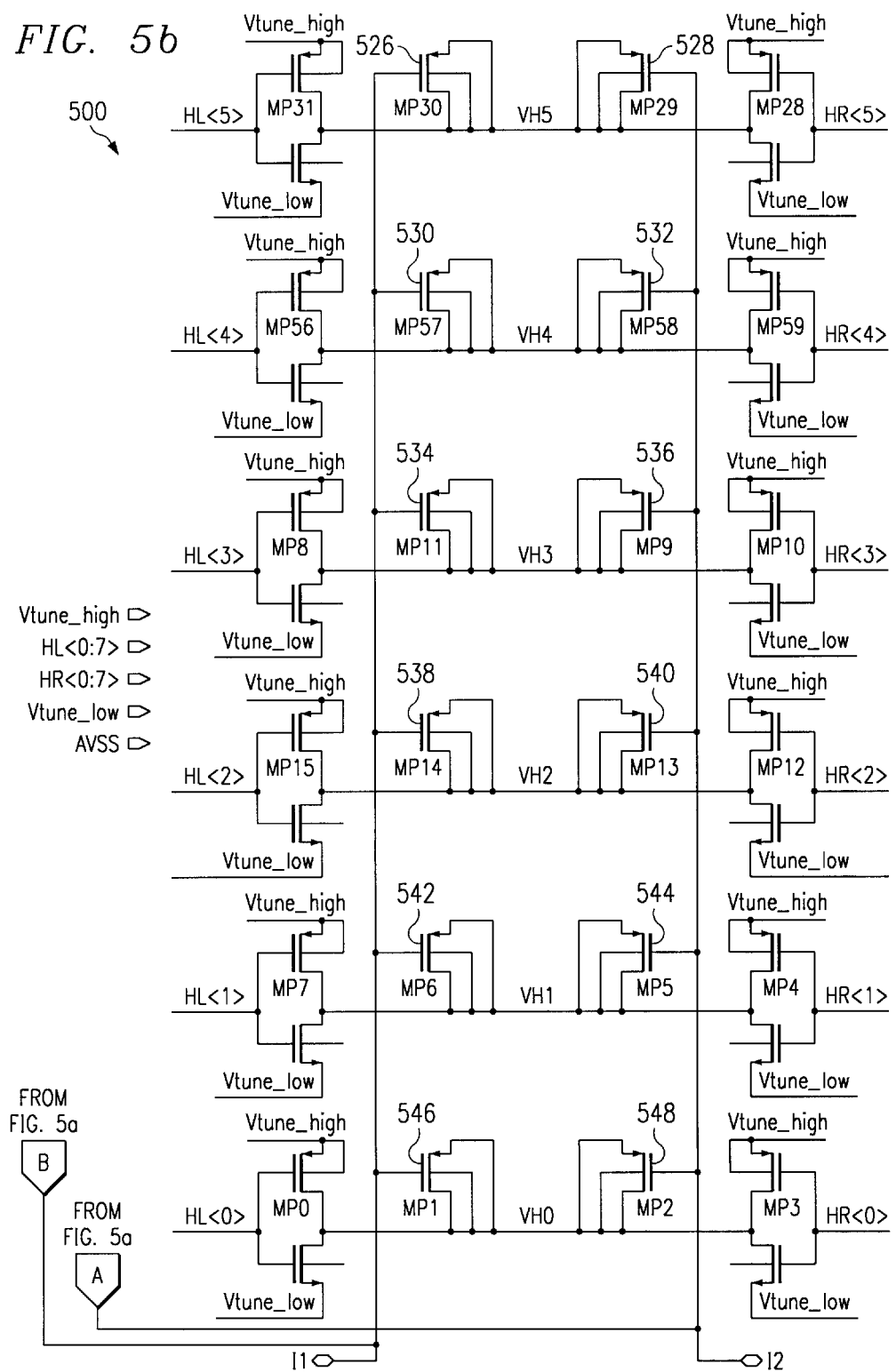

FIG. 5 is a schematic diagram illustrating a detailed high capacitor bank (HB) architecture 500 suitable for use with the DCO 200 depicted in FIG. 2. The HB 500 includes a plurality of varactors 502–548 configured as a binary-weighted array of controllable capacitors. The number of varactors/capacitors depends upon the number of bits in the control word, wherein the width of the control word may vary, depending upon the frequency range and resolution desired, as stated herein before. In the instant embodiment, eight lines, HL7/HR7-HL0/HR0, are presented to the HB 500. In any event, the cumulative capacitance of the controllable varactors 502–548, in their respective states as set by the state of their corresponding control line HL/HR pair, determines the capacitance presented to the tunable LC oscillator by the high capacitor bank (HB) 500. In the instant embodiment, the states of each control line HL/HR pair route the potentials $V_{tunehigh}$ 550 and $V_{tunelow}$ 552, where $V_{tunehigh}$ 550 and $V_{tunelow}$ 552 are operable to switch the capacitance associated with each control line pair HL/HR between a minimum value and a maximum value. $V_{tunehigh}$ 550 and $V_{tunelow}$ 552 are most preferably selected in a way such that voltage perturbations will be minimized with changes in frequency for a desired range of frequencies in order to minimize noise contributions associated with the power and ground lines. The HB 500 architecture can be seen to have a plurality of varactors associated with each control line. This is important to achieve a desired capacitance value when implementing specific CMOS manufacturing processes such that the desired frequency range and resolution can be accommodated for the tunable LC tank circuit using the HB 500 to form at least a portion of the tank circuit capacitance. A tunable LC tank circuit using the HB 500 is discussed more fully herein below with reference to FIG. 9. The physical sizes of the varactors (and therefore capacitance) associated with the HB 500 are selected to implement tuning over a frequency range of 765 MHz with a granularity of 3 MHz, as discussed above.

Figure 6A:
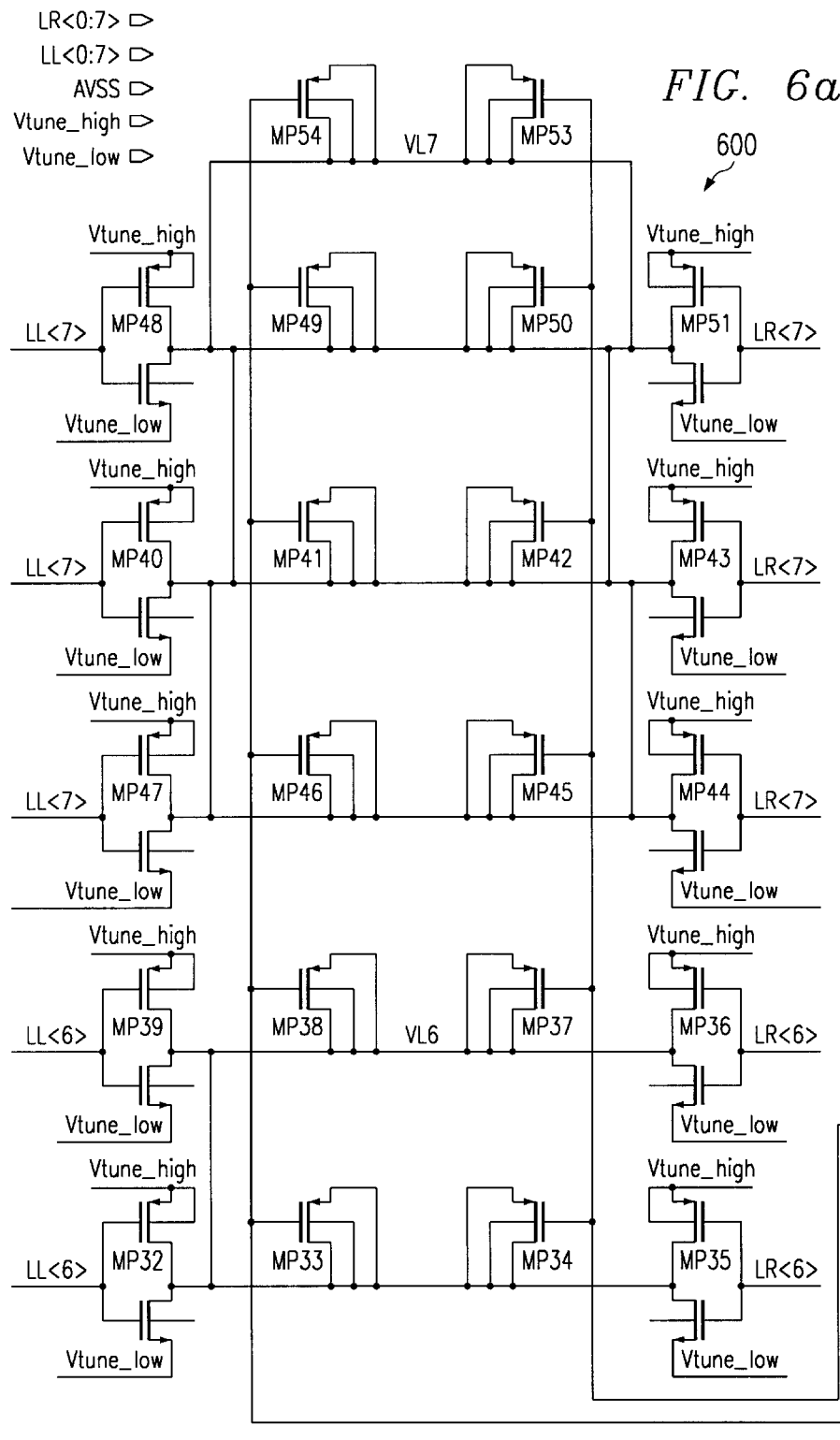
FIG. 6 is a schematic diagram illustrating a low capacitor bank architecture suitable for use with the DCO depicted in FIG. 2.
Figure 6B:
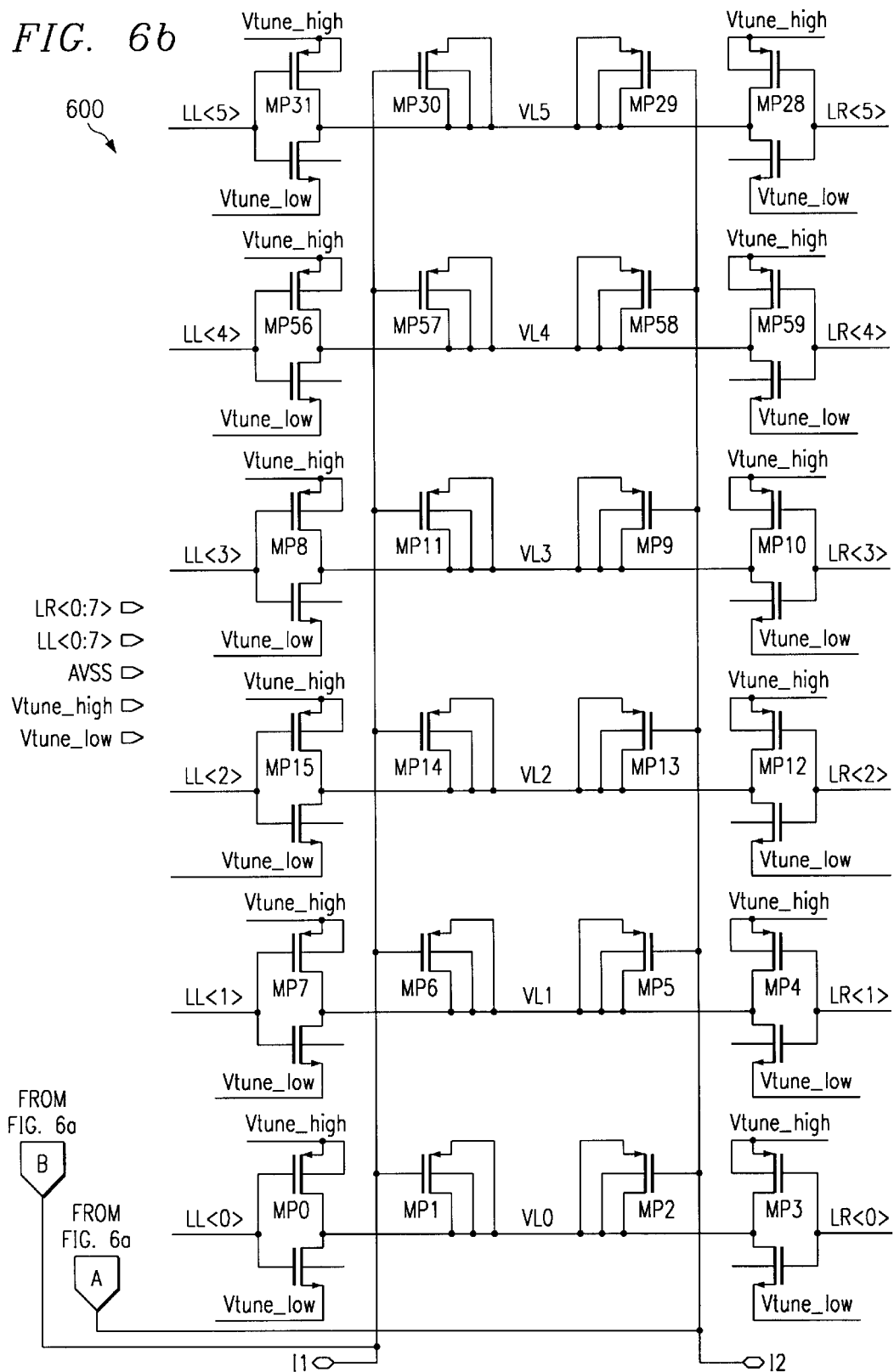

FIG. 6 is a schematic diagram illustrating a low capacitor bank architecture 600 suitable for use with the DCO 200 depicted in FIG. 2. The architecture and operation of the low capacitor bank (LB) 600 is identical with that described above in association with the high capacitor bank 500, except the physical sizes (and therefore capacitance) of the varactors associated with the LB 600 are smaller to allow finer tuning of the tunable LC tank circuit in order to implement tuning over a frequency range of 81.6 MHz with a granularity of 320 kHz, as discussed herein before.

Figure 7B:
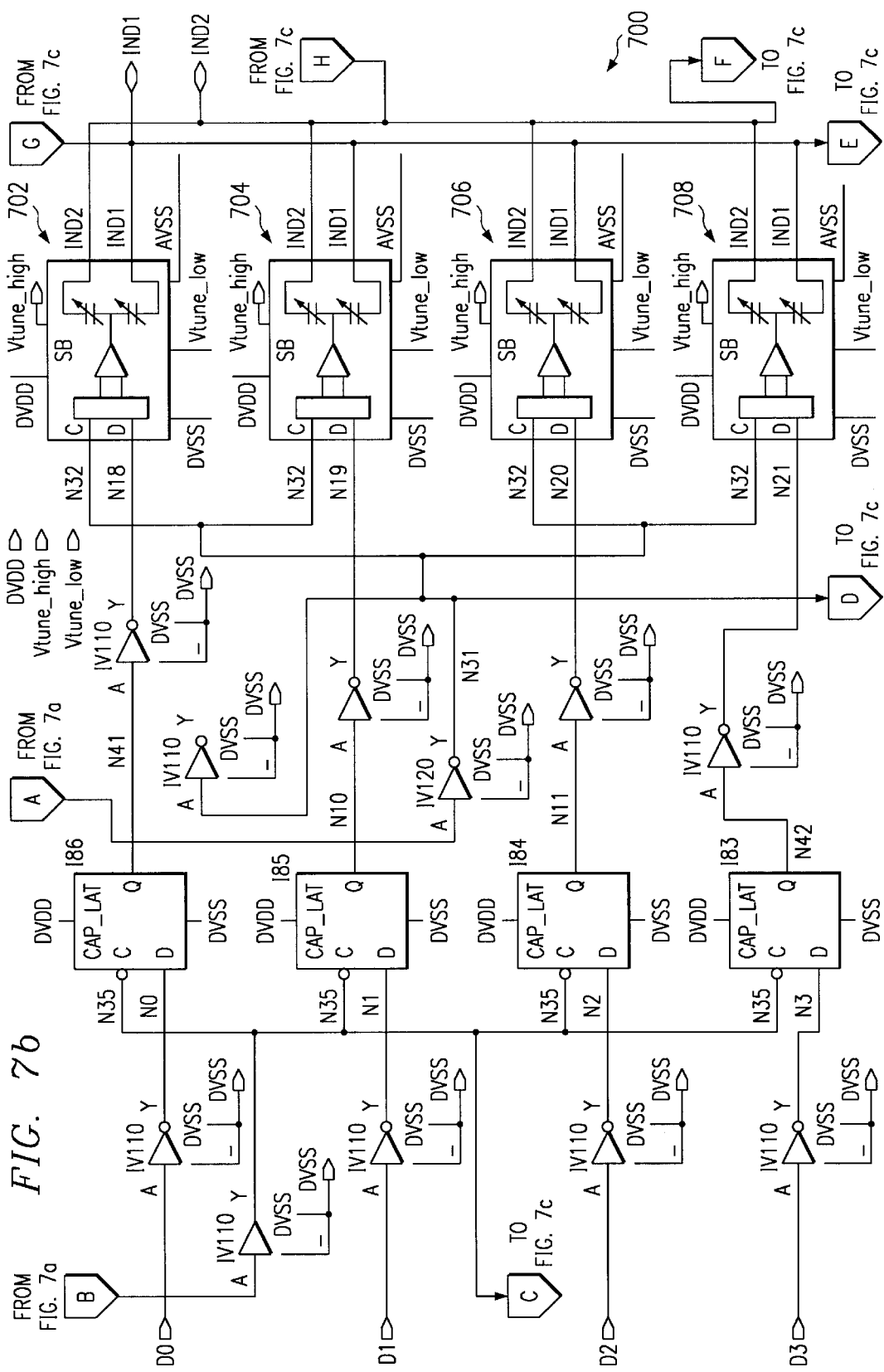
FIG. 7 is a schematic diagram illustrating a thermometer capacitor bank architecture suitable for use with the DCO depicted in FIG. 2.

FIG. 7 is a schematic diagram illustrating an identical one-eighth of a thermometer capacitor bank (TB) architecture 700 suitable for use with the DCO 200 depicted in FIG. 2. TB block 700 has eight pairs of unit-sized varactors 702–716 that can be combined with the HB 500 and LB 600 capacitor banks to allow even finer tuning of the tunable LC tank circuit in order to implement tuning over a frequency range of 640 kHz with a granularity of 10 kHz and therefore allow the DCO 200 to accommodate "BLUETOOTH" radio frequency communications. Each pair of unit-sized varactors 702–716 is switchably controlled by a control word bit (e.g. D0–D7) such as described herein before with reference to the HB 500 and LB 600 capacitor-arrays.

A more highly detailed drawing of a pair of unit-sized varactors 800 forming a capacitor pair for the thermometer capacitor bank (TB) 700 is shown in FIG. 8. The varactors 800 can be seen to be driven via a capacitance buffer driver 802. The buffer driver 802 operates in the optimal regions of the C-V (capacitance vs. voltage) characteristic in which voltage perturbations do not result in changes to the capacitance. One portion is called $V_{tunelow}$ and the other portion $V_{tunehigh}$. These voltage levels are then selected as the voltage levels to switch the respective varactors between their minimum and maximum capacitance levels as described herein before. One varactor 804 is then connected to one side 902 of the inductor 906 while the other varactor 806 is connected to the opposite side 904 of the inductor to implement the tunable LC tank circuit 900 discussed herein below with reference to FIG. 9.

Figure 9:
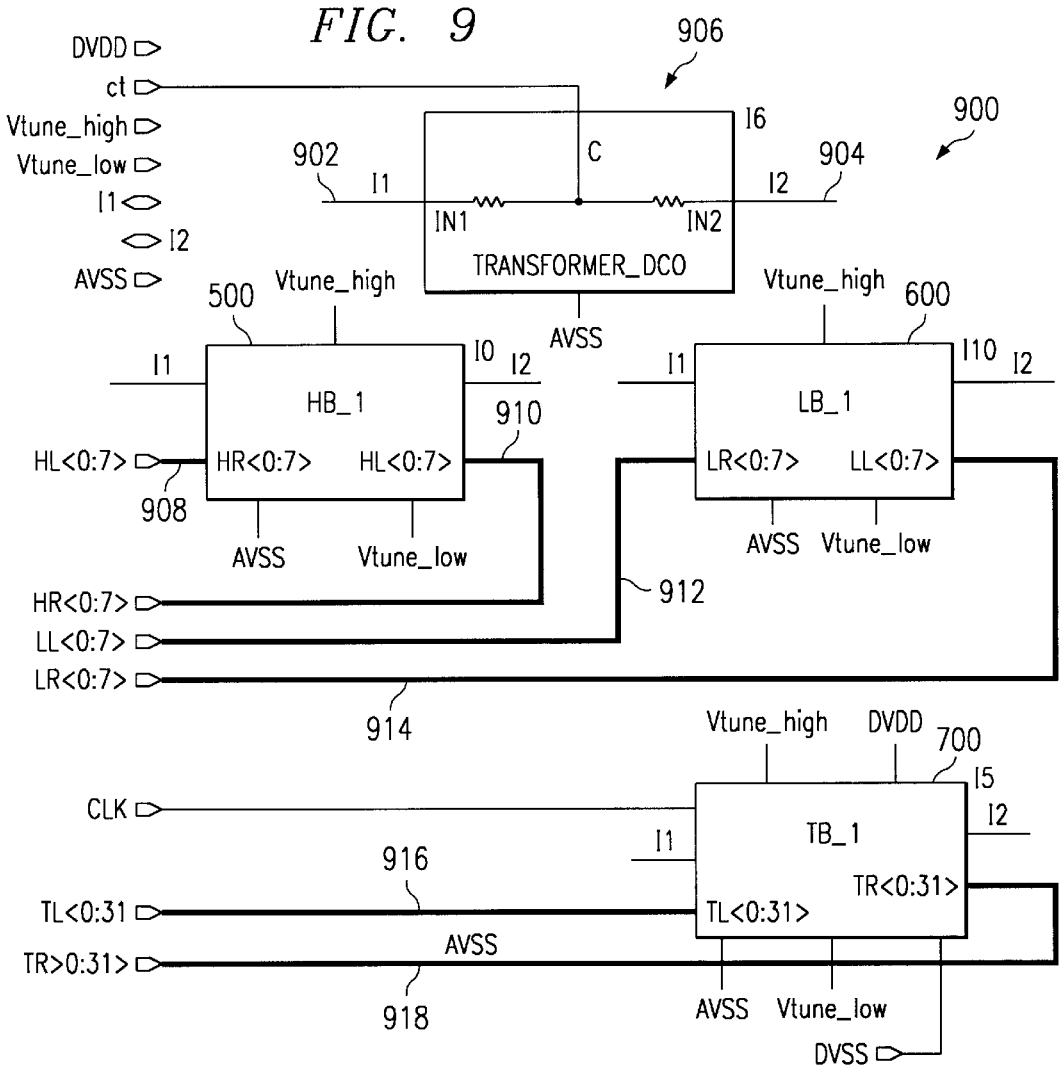
FIG. 9 is a schematic diagram illustrating a tunable LC tank circuit incorporating the high capacitor bank, low capacitor bank and thermometer capacitor bank circuits shown in FIGS. 5–7 respectively.

FIG. 9 is a schematic diagram illustrating a tunable LC tank circuit 900 incorporating the high capacitor bank 500, low capacitor bank 600 and thermometer capacitor bank 700 circuits shown in FIGS. 5–7 respectively. The requisite frequency control word is transmitted to the capacitor banks 500, 600, 700 via control (data input) lines 908–918 respectively. As stated above, the inductor 906 is a center-tapped transformer-like inductor wherein one side of the inductor 906 is tied to a left bank array of varactors and the right side of the inductor 906 is tied to a right bank array of varactors to implement the tunable LC tank circuit 900. Other LC configurations can also be used to implement the DCO in which separate (left, right) banks will not be necessary to control the frequency range and resolution.

Figure 10:
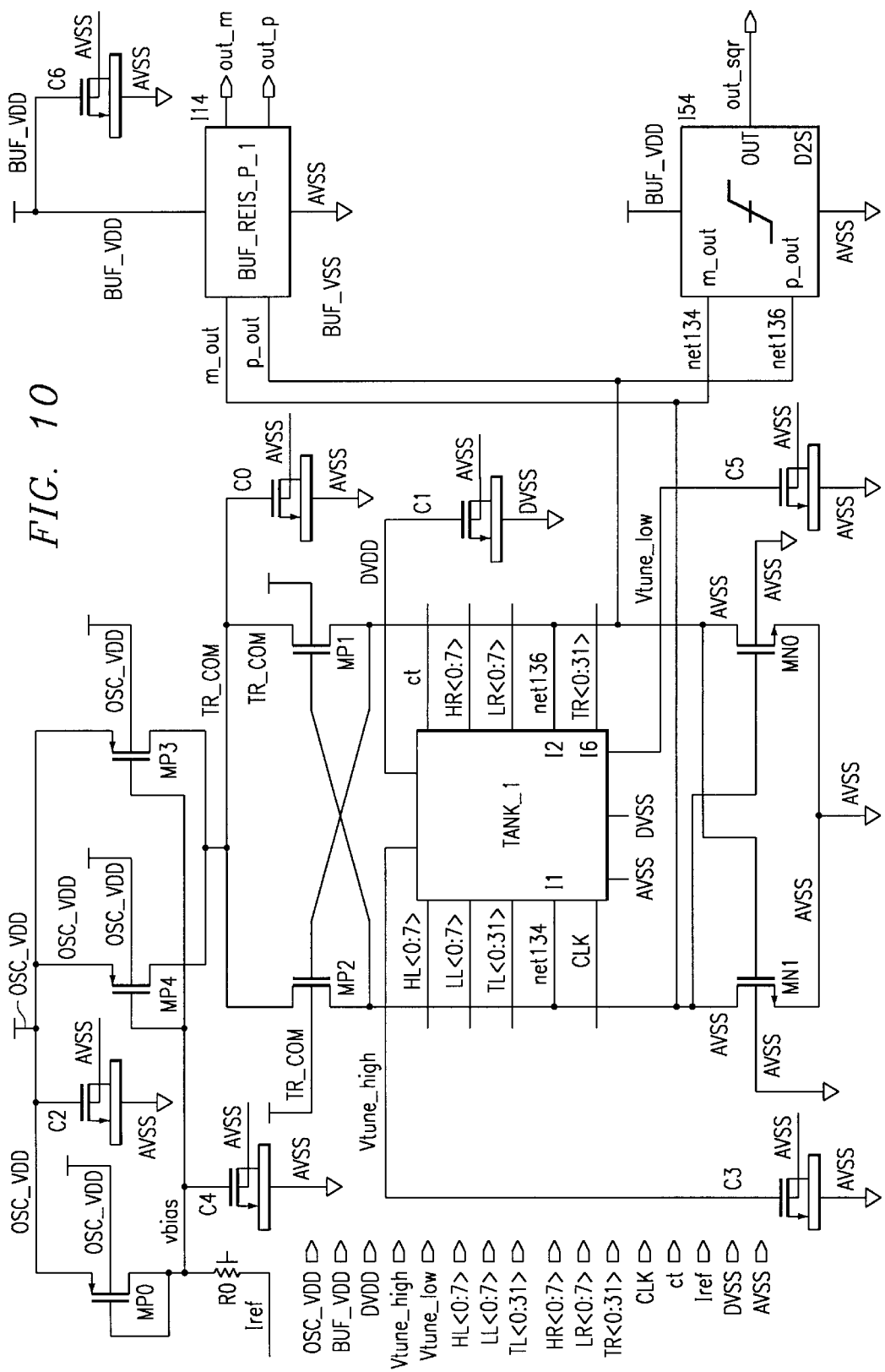
FIG. 10 is a schematic diagram illustrating a DCO configured as part of a system capable of generating an RF output signal and a digital output signal.

FIG. 10 is simply a more detailed schematic diagram illustrating the DCO 200 depicted in FIG. 2 and that is capable of generating both an RF output signal and a digital output signal.

Figure 11:
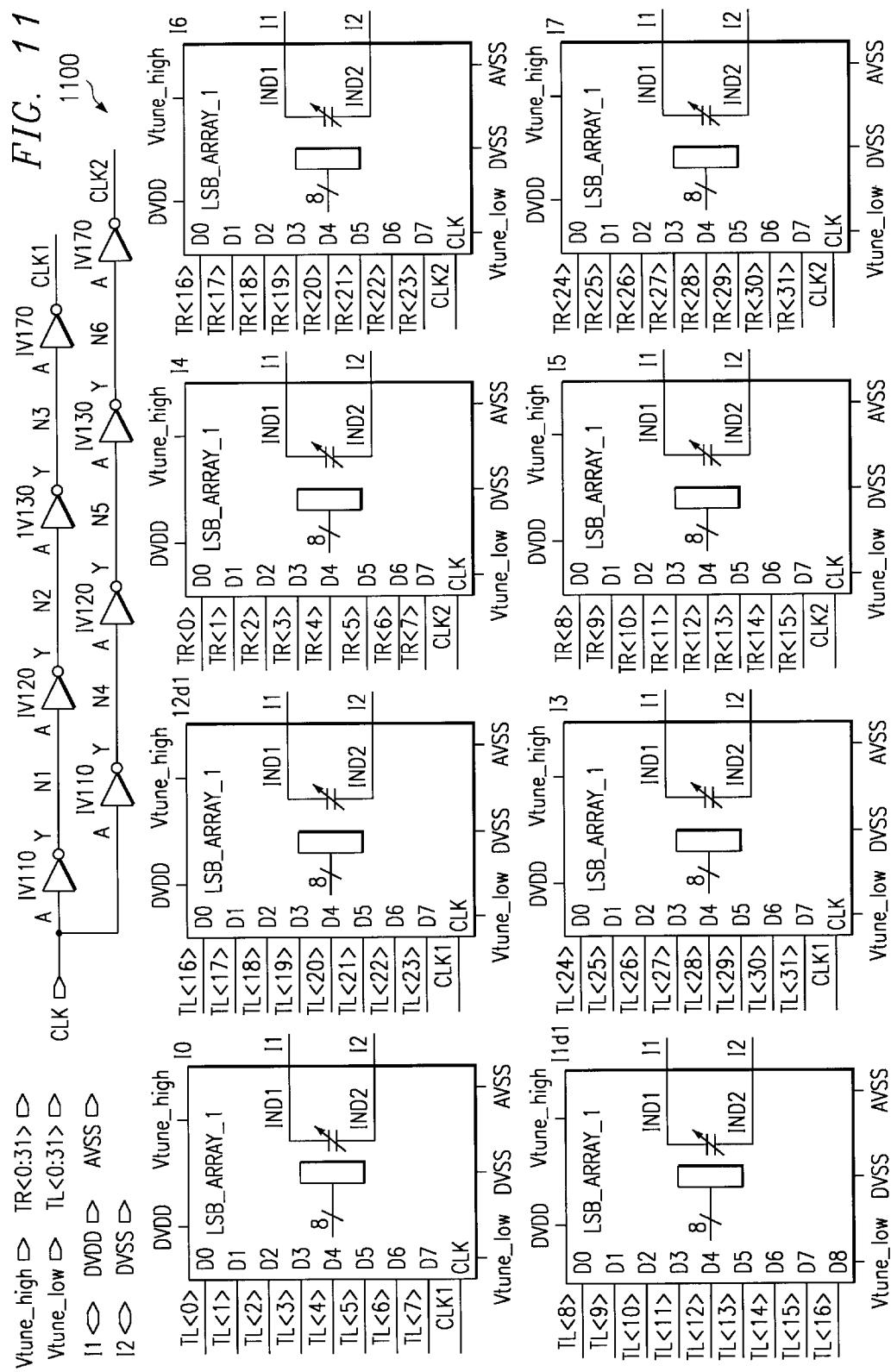
FIG. 11 illustrates a plurality of thermometer capacitor array banks such as shown in FIG. 7 and configured to minimize switching errors due to physical differences between individual varactor capacitors.

FIG. 11 simply illustrates a plurality 1100 of varactor capacitor array banks 700 configured to switch in a random pattern such that physical differences between the individual TB 700 varactors can be averaged during RF communications.

Figure 12:
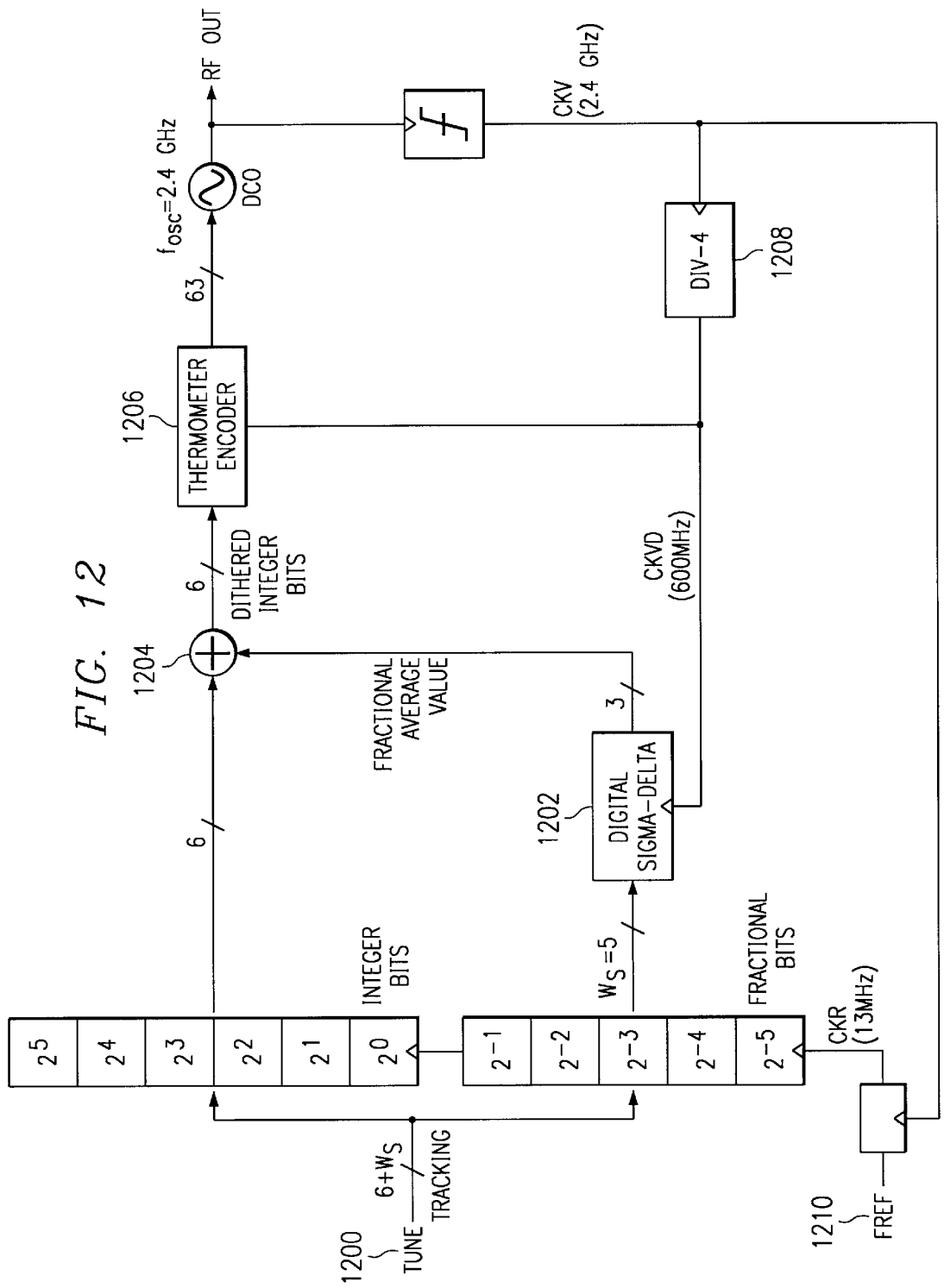
FIG. 12 is a simplified block diagram illustrating one embodiment of an amplitude dithering system suitable for use with the DCO depicted in FIG. 2.

FIG. 12 is a simplified block diagram illustrating how the above discussed dithering system is implemented for the DCO 200 depicted in FIG. 2. A tuning control word (TCW) 1200 is received that can be any number of desired bits required to implement a desired function. The tuning control word 1200 for the instant embodiment is depicted as having 6 integer bits and 5 fractional bits. The 5 fractional bits are dithered via digital sigma-delta modulator 1202 to generate a fractional time averaged value. This fractional average value is then summed via sum element 1204 with the 6 integer bits to generate 6 dithered integer bits that are then communicated to a thermometer encoder 1206. The thermometer encoder 1206 operates to enable N varactors in response to a thermometer encoder control input value. The actual dithering frequency is set by a clock divider 1208 that receives the DCO 200 digital output signal and divides it down to a frequency value that is significantly greater than the reference frequency 1210 to provide the desired resolution, but that is also low enough to provide a desired power dissipation. It can be seen that the dithering frequency is 600 MHz for the embodiment depicted in FIG. 12, although many other dithering frequencies can be used so long as the dithering frequency employed is sufficient to provide both the desired frequency resolution and the desired power dissipation.

Figure 3:
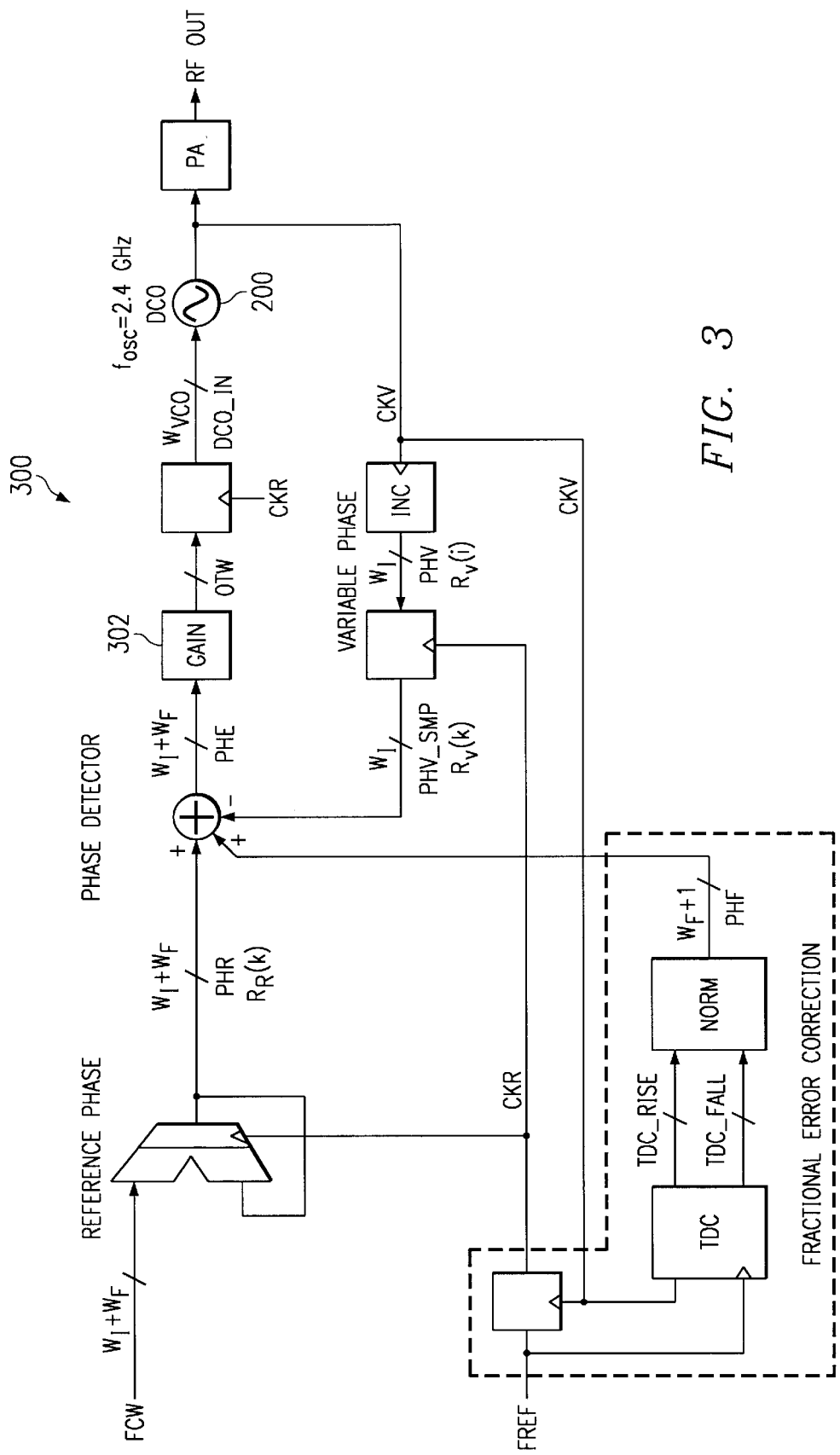
FIG. 3 is a diagram illustrating a digital phase-domain PLL frequency synthesizer suitable for incorporating the DCO depicted in FIG. 2.
Figure 13:
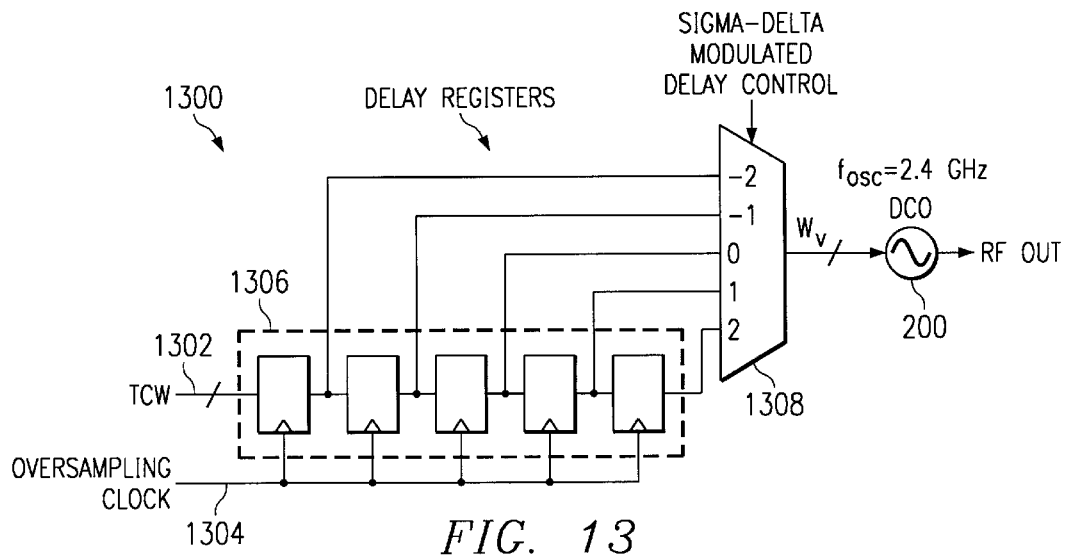
FIG. 13 is a simplified block diagram illustrating one embodiment of a time dithering technique suitable for use in association with the amplitude dithering system shown in FIG. 12 for time dithering the DCO tuning input.

FIG. 13 is a simplified block diagram illustrating one embodiment of a time dithering technique 1300 suitable for use in association with the dithering system shown in FIG. 12 for time dithering the DCO tuning input 1200. The tuning control word (TCW) 1302 is normally connected to the digitally-controlled oscillator (DCO) input through a gain stage 302 such as illustrated in FIG. 3 if a loop filter is not employed. An accurate discrete time dithering of the tuning control word 1302 is obtained by reclocking it by the high-frequency oversampling clock 1304 and passing it through a delay shift register 1306. A multibit input multiplexer 1308 synchronously selects the appropriate output of the delay register 1306 chain. In this manner, a means is provided for dynamically offsetting the actual DCO 200 update timing, that is done at the frequency reference rate, discretely by the oversampling clock 1304.

Figure 14:
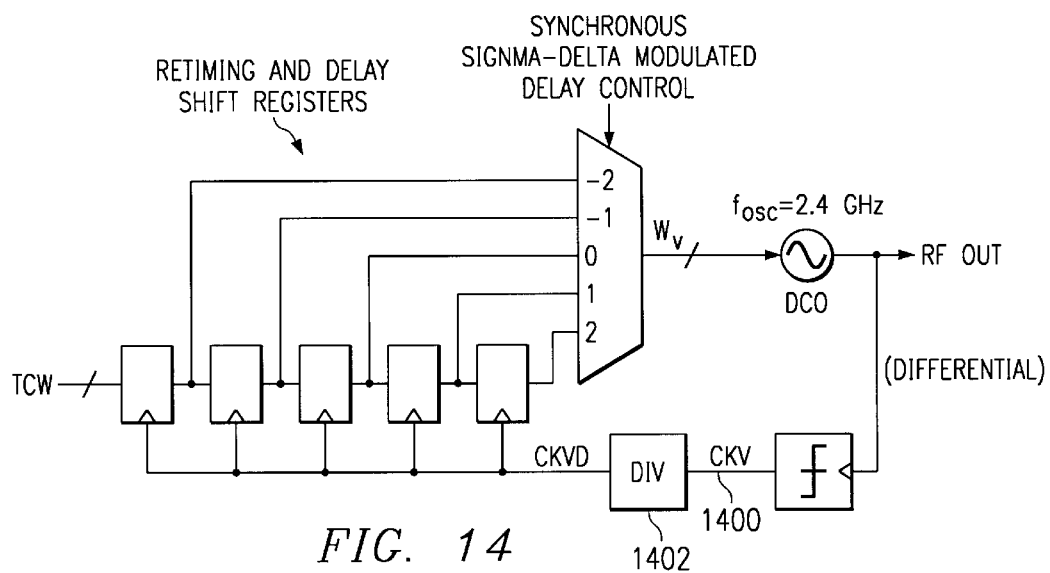
FIG. 14 is a simplified block diagram illustrating the time dithering technique shown in FIG. 13 adapted to use the digitized RF output of the synthesizer as the high-frequency oversampling clock after an appropriate frequency division by an edge-divider according to one embodiment.

The digitized RF output 1400 of the DCO 200 can be used as the high-frequency oversampling clock directly, or after an appropriate frequency division by an edge-divider 1402 as illustrated in FIG. 14. FIG. 14 is a simplified block diagram illustrating the time dithering technique shown in FIG. 13 adapted to use the digitized RF output of the synthesizer 300 depicted in FIG. 3 as the high-frequency oversampling clock after an appropriate frequency division by an edge-divider 1402 according to one embodiment of the present invention.

Figure 15:
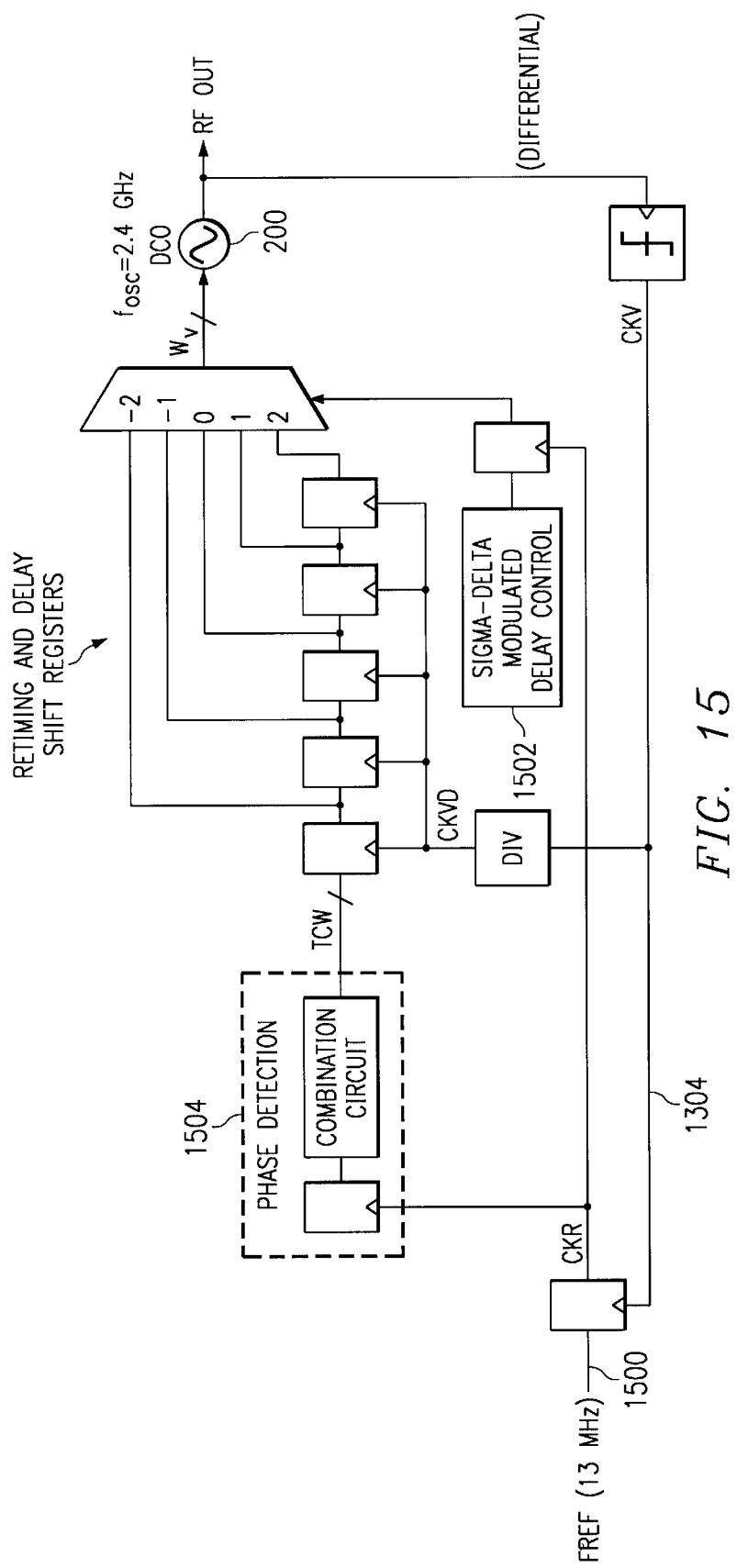
FIG. 15 is a simplified block diagram illustrating the time dithering technique shown in FIGS. 13 and 14 in which the phase detection operation is run synchronously to the reclocked frequency reference and is synchronously reclocked by the oversampling DCO clock according to one embodiment.

FIG. 15 is a simplified block diagram illustrating the time dithering technique shown in FIGS. 13 and 14 in which the phase detection operation 1504 is run synchronously to the reclocked frequency reference 1500 and is synchronously reclocked by the oversampling DCO clock 1304 according to one embodiment of the present invention. FIG. 15 then reveals further implementational details within the all-digital PLL architecture illustrated in FIG. 3. The phase detection operation is run synchronously to the reclocked frequency reference (CKR) and is synchronously reclocked by the oversampling DCO clock 1304. The Δ or ΣΔ modulator 1502 randomizes the small discrete timing deviations to the actual repetitive update of the DCO 200 such that the compare-frequency spurs are sufficiently blurred into the background noise. Properties of the modulator 1502 are most preferably selected based on the desired quantization noise characteristics in a manner familiar to those skilled in the mixed-signal art.

Figure 16:
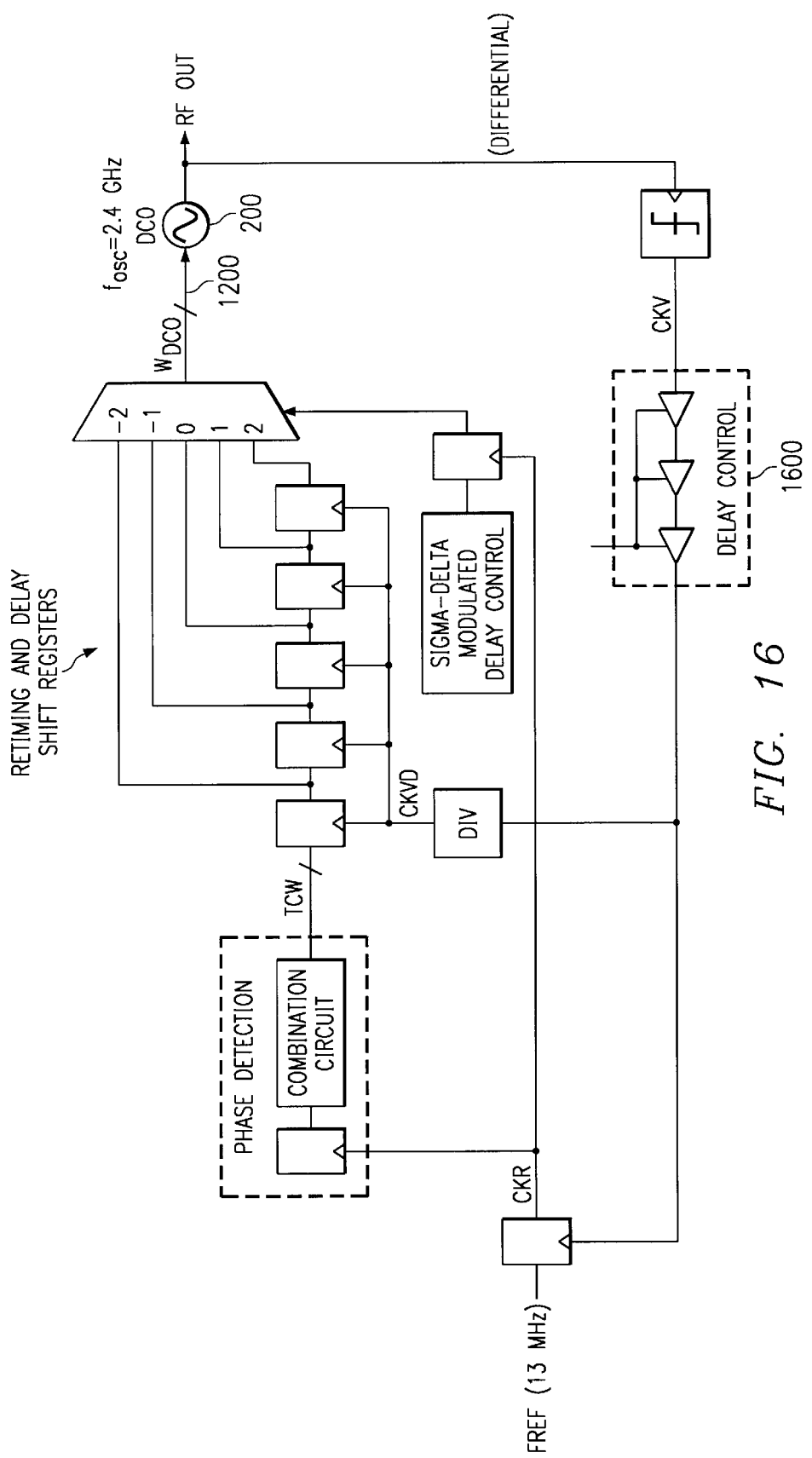
FIG. 16 is a simplified block diagram illustrating the time dithering technique shown in FIGS. 13–15 in which time dithering is implemented with a controlled-delay DCO synchronous tuning input and frequency reference retiming according to one embodiment of the present invention.

FIG. 16 is a simplified block diagram illustrating the time dithering technique shown in FIGS. 13–15 in which time dithering is implemented with a controlled-delay DCO synchronous tuning input and frequency reference retiming according to one embodiment of the present invention. FIG. 16 reveals yet further implementational details within the all-digital PLL architecture depicted in FIG. 3. The actual sampling update instances, as presented to the DCO 200 tuning input 1200, are controlled such that the DCO 200 varactor perturbations occur at the least perturbing moments, i.e., when the voltage and charge on the capacitive part of the LC tank are the lowest. This results in minimization of the oscillator phase noise, but requires precise timing control and complexity of an additional control 1600 to find the optimal DCO 200 delay.

Figure 17:
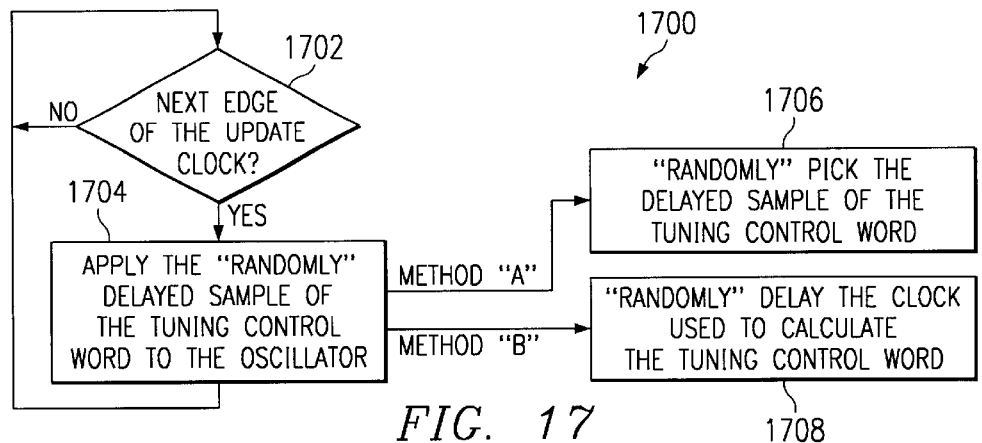
FIG. 17 is a flow diagram illustrating oscillator time dithering principles according to particular embodiments of the present invention.

FIG. 17 is a simplified flow diagram 1700 illustrating basic oscillator time dithering principles according to particular embodiments of the present invention. Specifically, the update clock is first continuously checked to determine if the next clock edge has arrived as shown in block 1702. If a new update clock edge is received, then a randomly delayed sample of the tuning control word (TCW) discussed herein before is applied to the DCO 200 as shown in block 1704. The TCW can be randomly delayed by either 1) randomly picking the delayed sample of the TCW, or 2) randomly delaying the clock used to calculate the TCW, as shown in blocks 1706 and 1708 respectively. Instead of calculating and applying the tuning word input to the DCO 200 at evenly-spaced and deterministic time intervals, as conventionally defined by the frequency reference clock, "random" timestamp deviations at each update are exercised. The statistical properties of these time-shift deviations will determine how much of the spectral spur energy gets spread into the background. The time dithering of the DCO tuning input could then be fundamentally implemented in one of two ways: time dithering of the oscillator tuning word itself or time dithering of the actual time the oscillator tuning word gets calculated and applied, as discussed herein above.

Figure 18:
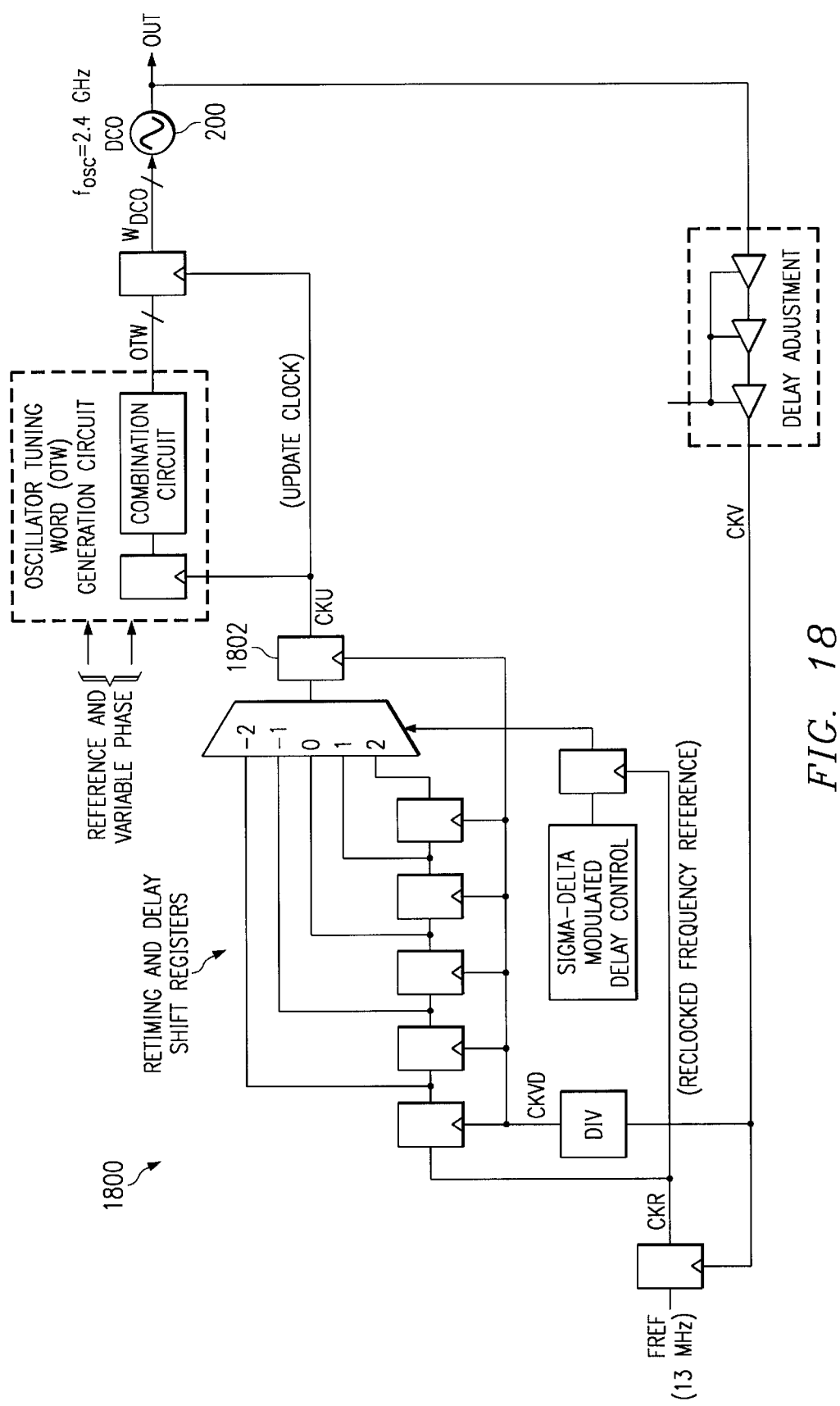
FIG. 18 is a simplified block diagram illustrating another time dithering technique wherein sampling edges of an update clock are randomized instead of the oscillator tuning word input such as shown in FIGS. 13–16.

FIG. 18 is a simplified block diagram illustrating another time dithering technique 1800 wherein sampling edges of an update clock 1802 are randomized instead of the oscillator tuning word input such as shown in FIGS. 13–16. The update clock 1802 is then used to trigger the generation and sampling of the DCO 200 tuning input. The operational order of calculating the tuning word and time dithering is thus reversed. This leads to substantial hardware saving since delaying the clock 1802, which takes a single bit, is preferred to delaying a multibit tuning word. Another clear benefit if a digitally-intensive system is that the complex tuning control word (oscillator tuning word) calculation operation is more randomly spread in time and exhibits less temporal correlation. Consequently, this further leads to reduction of frequency spurs.

If a silicon chip die also contains a microprocessor and a digital signal processor (DSP) on the same substrate, which is often the case with modern RF transceivers, it is advantageous to clock it synchronously to the time-dithered update clock CKU 1802. Two significant benefits could thus be obtained: First, randomly modulating the clock period prevents substrate noise with strong periodical correlation to couple from the digital baseband to the RF section. Second, if the processor clock exhibits enough delay from the synthesizer update clock, the phase detection and tuning word adjustment operations occur during the "quiet" periods of the DSP.

Figure 19:
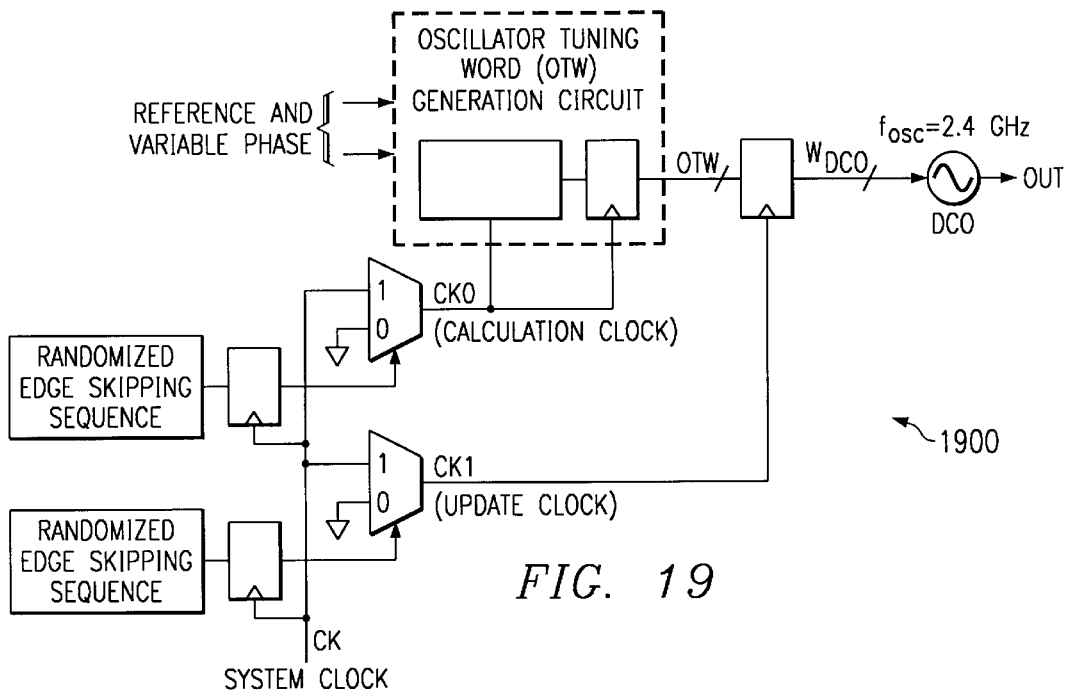
FIG. 19 is a simplified block diagram illustrating yet another time dithering technique wherein whole clock edge-skipping is employed to avoid use of a high-frequency oversampling clock such as shown in FIGS. 13–17.

FIG. 19 is a simplified block diagram illustrating yet another time dithering technique 1900 wherein whole clock edge-skipping is employed to avoid use of a high-frequency oversampling clock 1304 such as shown in FIGS. 13–17. The time dithering technique 1900 operates to 1) decouple the tuning word calculation operation from applying it to the DCO 200 and 2) perform a whole clock edge-skipping procedure to avoid dealing with a high frequency oversampling clock. Random stream generators are most preferably employed such that the update clock edges pass through only when the calculation clock edges are blocked. This will ensure that the DCO 200 frequency is updated far from the digital logic activities.

Figure 20:
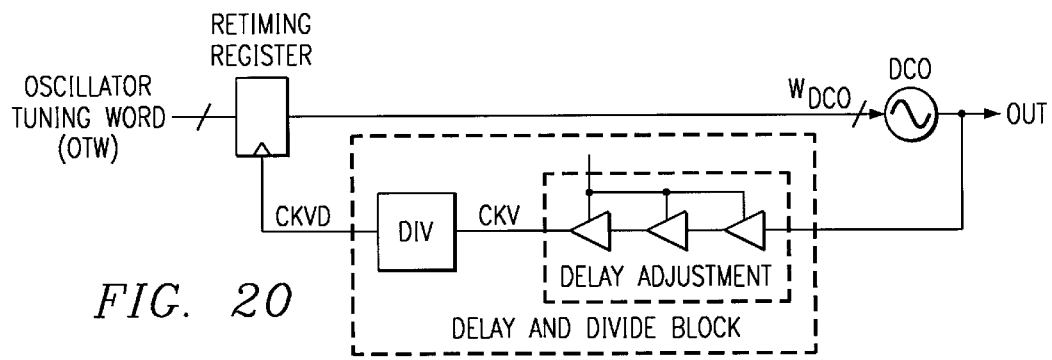
FIG. 20 is a simplified block diagram illustrating synchronously-optimal sampling and timing adjustment of a DCO input.

FIG. 20 is a simplified block diagram illustrating synchronously-optimal sampling and timing adjustment of a DCO input. Changing the tuning control input of an oscillator, in order to adjust its phase/frequency in a normal PLL operation, is quite a disturbing event that reveals itself as jitter or phase noise. This is especially noticeable in case of a sample-mode oscillator, such as the DCO, where its oscillating frequency is commanded to change at discrete times. For example, if the oscillating frequency of an LC tank is controlled by a voltage-to-capacitance conversion device (e.g., varactor), the instances when the oscillating energy is fully stored in a capacitor are the worst moments to change the capacitance. Changing the capacitance at those moments causes the electrical potential to change, since the total charge must be preserved, thus introducing the largest perturbation. Changing the varactor capacitance at times when it is fully discharged will not affect its voltage and thus will not contribute to the oscillating jitter.

A solution to the foregoing problem was found by the present inventors to precisely control the timing moments when the varactor capacitance change is allowed to occur, thus eliminating jitter due to the tuning word update. This is implemented by feeding the delayed oscillator edge transitions back as the clock input to the register retiming stage, as shown in FIG. 7. The retiming stage ensures that the input control data, as seen by the oscillator, is allowed to change only at precise and controllable times after the oscillator zero-crossings. The feedback loop delay is set algorithmically to minimize the oscillator jitter.

In summary explanation, a fully digitally-controlled LC tank oscillator (DCO) has been described that uses a bank of binary and/or equal weighted capacitors that are switched between only two frequency independent potentials in accordance with a method of time dithering the DCO tuning input. The resolution of the LSB capacitor is modulated using fast switching (dithering) between the two states, where the averaging is achieved by the Q factor of the LC oscillator tank in association with the modulation index of the resulting frequency modulation that is very small compared with the modulation speed. Spurious emissions are reduced using sigma-delta modulation techniques and residual tones can be further suppressed by an antenna filter.

A digital tuning control word (TCW) input is synchronous to a compare frequency of a phase detector. An accurate discrete time dithering of the TCW is obtained by reclocking it by a high-frequency oversampling clock and passing it through a delay shift register. A multibit input multiplexer synchronously selects the appropriate output of the delay register chain. This technique provides a means of dynamically offsetting the actual DCO update timing, which is done at the frequency reference rate, discretely by the oversampling clock. The digitized RF output of an associated synthesizer can, for example, be used as the high-frequency oversampling clock directly or after an appropriate frequency division by an edge-divider. TCW tuning is run synchronously to the reclocked frequency reference and is synchronously reclocked by the oversampling DCO clock. The Δ or ΣΔ modulator randomizes the small discrete timing deviations to the actual repetitive update of the DCO oscillator such that the compare-frequency spurs are sufficiently blurred into the background noise. Properties of the modulator are most preferably based on the desired quantization noise characteristics.

This invention has been described in considerable detail in order to provide those skilled in the digitally-controlled VCO (DCO) art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. For example, while certain embodiments set forth herein illustrate various hardware implementations, the present invention shall be understood to also parallel structures and methods using software implementations as set forth in the claims.

What is claimed is:

1. A digitally-controlled oscillator (DCO) tuning input circuit comprising:

a shift register having a plurality of delay registers, the shift register having an input operative to receive a digital tuning control word, each delay register having a digital input, a digital output and a clocking input, wherein the clocking input of each delay register is responsive to a high frequency oversampling clock to time delay the digital tuning control word received at the shift register input such that a distinct discrete time delayed tuning control word is generated at each delay register digital output; and a multiplexer having a plurality of digital inputs and further having a digital output, the plurality of multiplexer digital inputs configured to receive the distinct discrete time delayed tuning control word generated at the digital output of each delay register;

wherein the multiplexer is responsive to a synchronous pseudo-random modulated delay control to selectively pass to its digital output, the distinct discrete time delayed tuning control words received at the plurality of multiplexer digital inputs such that the distinct discrete time dithered tuning control words at the multiplexer digital output are capable of modulating a DCO tuning input in a manner that minimizes spurious tones generated by the DCO.

2. The digitally-controlled oscillator (DCO) tuning input circuit according to claim 1 wherein the pseudo-random modulated delay control is a sigma-delta modulated delay control.

3. The digitally-controlled oscillator (DCO) tuning input circuit according to claim 1 further comprising an edge divider configured to receive and frequency divide a digital clock generated by the DCO to generate the high frequency oversampling clock therefrom.

4. The digitally-controlled oscillator (DCO) tuning input circuit according to claim 1 further comprising:

a tuning control word generation circuit; and a frequency reference that is reclocked to a digital clock generated by the DCO, wherein the reclocked frequency reference is operational to clock the pseudo-random modulated delay control and is further operational to clock the tuning control word generation circuit such that the digital tuning control word is synchronized thereto.

5. The digitally-controlled oscillator (DCO) tuning input circuit according to claim 4 further comprising a delay control circuit responsive to the digital clock generated by the DCO and further responsive to an input delay control signal to selectively delay frequency reference retiming signals and DCO synchronous tuning input signals such that DCO perturbations are minimized.

6. A method of time dithering a digitally-controlled oscillator (DCO) tuning input comprising the steps of:

providing a DCO tuning input circuit having a shift register, a multiplexer clocked via a sigma-delta modulated delay control, and a frequency reference reclocked to a high-frequency oversampling clock;

generating a digital tuning control word that is synchronized to the reclocked frequency reference;

synchronizing the shift register to a high-frequency oversampling clock;

shifting the synchronized digital tuning control word via the shift register to generate a stream of delayed tuning control words; and selectively passing the stream of delayed tuning control words to a DCO tuning input via the multiplexer clocked to a sigma-delta modulated delay control such that the DCO is capable of generating an output signal in a manner that minimizes spurious tones.

7. The method of time dithering a digitally-controlled oscillator (DCO) tuning input according to claim 5 further comprising the step of dividing the DCO output signal via an edge divider to generate the high-frequency oversampling clock that synchronizes the shift register.

8. The method of time dithering a digitally-controlled oscillator (DCO) tuning input according to claim 7 further comprising the step of delaying the edge divided DCO output signal in response to a delay control element such that the high-frequency oversampling clock that reclocks the frequency reference and the divided high-frequency oversampling clock that synchronizes the shift register operate to time dither the DCO tuning input in a manner that minimizes spurious tones associated with the DCO output signal.

9. A digitally-controlled oscillator (DCO) tuning input circuit comprising:

a shift register having a plurality of delay registers, the shift register having an input operative to receive a digital tuning control word, each delay register having a digital input, a digital output and a clocking input, wherein the clocking input of each delay register is responsive to a divided high-frequency oversampling clock to time delay the digital tuning control word received at the shift register input such that a distinct discrete time delayed tuning control word is generated at each delay register digital output;

an edge divider configured to divide the digital signal and generate the divided high-frequency oversampling clock therefrom;

a frequency reference synchronized to the high-frequency oversampling clock to generate a reclocked frequency reference therefrom;

a sigma-delta modulated multiplexer having a plurality of digital inputs and further having a digital output, the plurality of multiplexer digital inputs configured to receive the distinct discrete time dithered tuning control word generated at the digital output of each delay register in response to the reclocked frequency reference, and further in response to a sigma-delta modulated delay control such that the multiplexer will selectively pass to its digital output, the distinct discrete time dithered tuning control words received at the plurality of digital inputs wherein the distinct discrete time dithered tuning control words at the multiplexer digital output are capable of modulating a DCO tuning input in a manner that minimizes spurious tones generated by the DCO.

10. A digitally-controlled oscillator (DCO) tuning input circuit comprising:

delaying means for receiving and shifting a digital tuning control word to generate a stream of distinct tuning control words in response to divided-down high-frequency oversampling clock; and means for multiplexing the stream of distinct tuning control words in response to a high-frequency oversampling clock such that the multiplexed stream of distinct tuning control words are capable of modulating a DCO tuning input in a manner that causes the DCO to minimize spurious tones associated with a DCO output signal.

11. The digitally-controlled oscillator (DCO) tuning input circuit according to claim 10 further comprising means for edge-dividing the DCO output signal to generate a high-frequency clock therefrom.

12. The digitally-controlled oscillator (DCO) tuning input circuit according to claim 11 further comprising means for dividing the high-frequency clock to generate the divided-down high-frequency oversampling clock therefrom.

13. The digitally-controlled oscillator (DCO) tuning input circuit according to claim 12 further comprising means for synchronizing a reference clock in response to the high frequency clock to generate the high-frequency oversampling clock therefrom.

14. A digitally-controlled oscillator (DCO)) tuning input circuit comprising:

delaying means for receiving and shifting a digital tuning control word to generate a stream of distinct timing control words in response to divided-down high-frequency oversampling clock;

means for multiplexing the stream of distinct tuning control words in response to a high-frequency oversampling clock such that the multiplexed stream of distinct tuning control words are capable of modulating a DCO tuning input in a manner that causes the DCO to minimize spurious tones associated with a DCO output signal;

means for edge-dividing the DCO output signal to generate a high-frequency clock therefrom; and means for sigma-delta modulating the multiplexing means such that frequency reference retiming signals and DCO synchronous tuning signals are delayed to minimize perturbations associated with DCO output signals.

15. A digitally-controlled oscillator (DCO) tuning input circuit comprising:

a shift register having a plurality of delay registers, the shift register having an input operative to receive a reclocked frequency reference, each delay register having a digital input, a digital output and a clocking input, wherein the clocking input of each delay register is responsive to a high-frequency oversampling clock to time delay the reclocked frequency reference received at the shift register input such that a distinct discrete time-delayed reclocked frequency reference is generated at each delay register digital output;

a multiplexer having a plurality of digital inputs and further having a digital output, each multiplexer digital input configured to receive a distinct discrete time-delayed reclocked frequency reference generated at the digital output of a respective delay register, wherein the multiplexer is responsive to a synchronous pseudo-random modulated delay control to selectively pass to its digital output, the distinct discrete time delayed reclocked frequency reference received at the plurality of multiplexer digital inputs; and an oscillator tuning word generation circuit operative to receive the distinct discrete time-delayed reclocked frequency reference passed to the multiplexer digital output in response to an update clock to supply a randomly delayed sample of an oscillator tuning word to the DCO such that spurious tones generated by the DCO are substantially eliminated, wherein the update clock is responsive to the high-frequency oversampling clock.

16. The digitally-controlled oscillator (DCO) tuning input circuit according to claim 14 wherein the pseudo-random modulated delay control is a sigma-delta modulated delay control.

17. The digitally-controlled oscillator (DCO) tuning input circuit according to claim 14 further comprising an edge divider configured to receive and frequency divide a digital clock generated by the DCO to generate the high-frequency oversampling clock therefrom.

18. The digitally-controlled oscillator (DCO) tuning input circuit according to claim 14 wherein the reclocked frequency reference is reclocked to a digital clock generated by the DCO, wherein the reclocked frequency reference is operational to clock the pseudo-random modulated delay control.

19. The digitally-controlled oscillator (DCO) tuning input circuit according to claim 17 further comprising a delay control circuit responsive to the digital clock generated by the DCO and further responsive to an input delay control signal to selectively delay frequency delay reference retiming signals such that DCO output perturbations are minimized.

* * * * *